(12) United States Patent
Buchman et al.

(10) Patent No.: US 8,645,149 B2
(45) Date of Patent: Feb. 4, 2014

(54) TESTING METHOD AND SYSTEM

(75) Inventors: Jeffrey A. Buchman, Mission Viejo, CA (US); James L. Tarpo, Aliso Viejo, CA (US)

(73) Assignee: Balboa Water Group, Inc., Tustin, CA (US)

( * ) Notice: Subject to any disclaimer, the term of this patent is extended or adjusted under 35 U.S.C. 154(b) by 1803 days.

(21) Appl. No.: 11/625,625

(22) Filed: Jan. 22, 2007

(65) Prior Publication Data

US 2007/0233509 A1  Oct. 4, 2007

(51) Int. Cl.
*G06Q 10/00* (2012.01)
*G01R 27/28* (2006.01)

(52) U.S. Cl.
USPC .......................................... 705/1.1; 702/118

(58) Field of Classification Search
USPC .......................................... 705/1.1; 702/118
See application file for complete search history.

(56) References Cited

U.S. PATENT DOCUMENTS

| | | | |
|---|---|---|---|
| 3,777,260 A * | 12/1973 | Davies et al. | 324/715 |
| 4,290,015 A * | 9/1981 | Labriola | 324/750.01 |
| 4,504,782 A * | 3/1985 | Zbinden | 324/551 |
| 4,718,064 A * | 1/1988 | Edwards et al. | 714/28 |
| 5,559,720 A | 9/1996 | Tompkins et al. | |
| 5,663,656 A * | 9/1997 | Wilson et al. | 324/763.01 |
| 6,055,299 A * | 4/2000 | Daoud | 379/12 |
| 6,282,370 B1 | 8/2001 | Cline et al. | |
| 6,587,739 B1 * | 7/2003 | Abrams et al. | 700/83 |
| 6,643,108 B2 | 11/2003 | Cline et al. | |
| 6,676,831 B2 | 1/2004 | Wolfe | |
| 6,747,367 B2 * | 6/2004 | Cline et al. | 307/11 |
| 6,756,907 B2 | 6/2004 | Holloway | |
| 6,763,490 B1 | 7/2004 | Krech, Jr. et al. | |
| 7,154,257 B2 * | 12/2006 | Le et al. | 324/750.19 |
| 7,158,909 B2 | 1/2007 | Tarpo et al. | |
| 2002/0057091 A1 | 5/2002 | Hensler et al. | |
| 2003/0020506 A1 | 1/2003 | Prokopp | |
| 2003/0171111 A1 | 9/2003 | Clark | |

OTHER PUBLICATIONS

Peak Group, Functional Test Case Study: Traffic Management Systems, http://www.The peakgroup.com, downloaded Aug. 30, 2005, 2 pgs.
AllianceLabs, PCB Functional Test; Automated PCB Functional Test and PCB Test Fixtures; http://www.alliancelabs.com/pcb_func_testers.htm, downloaded Aug. 30, 2005, 1 pg.
AllianceLabs, Custom Testers; Custom Systems to Test Just About Anything; http://www.alliancelabs.com/custom_testers.htm, downloaded Aug. 30, 2005, 1 p.
Acculogic, Functional Test; Tracer 2000 Functional Test System, http://www.acculogic.com/Products/FunctionalTest.htm, downloaded Aug. 30, 2005, 2 pgs.
National Instruments, TestStand and Lab View Automate PCB Functional Test for Lifeline Systems Telephone and Communicator, http://sine.ni.com/csol/cds/item/vw/p/id/450/mid/124100, downloaded Aug. 30, 2005, 2pgs.

* cited by examiner

Primary Examiner — Dennis Ruhl
(74) Attorney, Agent, or Firm — Larry K. Roberts

(57) ABSTRACT

A method and system for functionally testing units under test, such as electronic controller boards for a spa system.

17 Claims, 21 Drawing Sheets

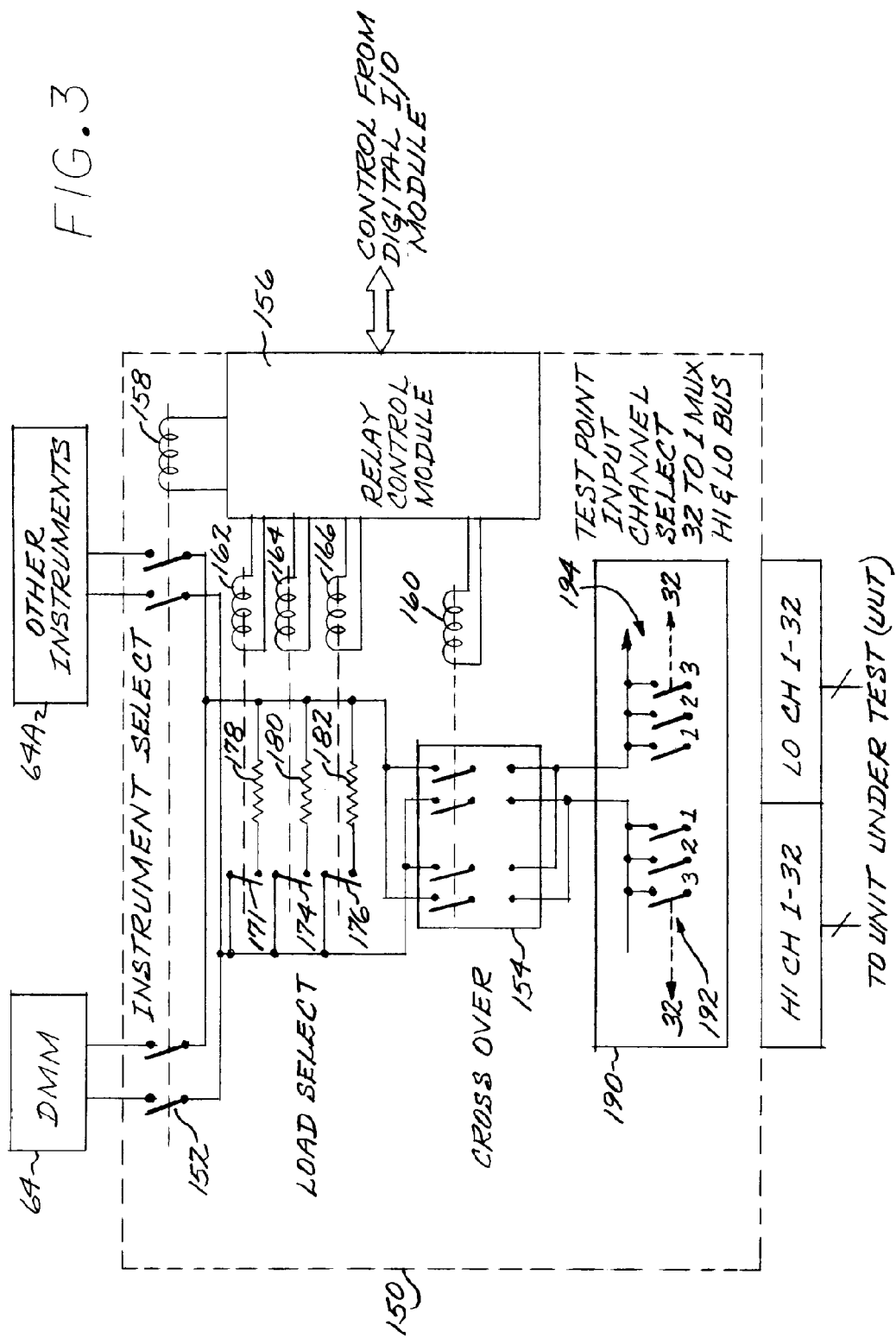

REPORT: DETAILS   Details of a single item from current Report. For detail of another item select a different "View Detail" link above.

| Time Tag | Unit Serial Number | Test Name | Value | Pass Value | Low | High | Pass/Fail |
|---|---|---|---|---|---|---|---|
| 1-20-2006 8:39:43 | 52568***200301090170 | PWR INPUT - XFMR | 0.043 | ---- | 0.036 | 0.054 | ✓ |
| 1-20-2006 8:39:43 | 52568***200301090170 | PWR INPUT - WHT_to_RED | 25.029 | ---- | 20 | 30 | ✓ |
| 1-20-2006 8:39:43 | 52568***200301090170 | WIRE CONFIG TEST - W1 P1 240V | 0.000 | ---- | 0 | 0.025 | ✓ |
| 1-20-2006 8:39:43 | 52568***200301090170 | WIRE CONFIG TEST - W2 P2 240V | 0.000 | ---- | 0 | 0.025 | ✓ |
| 1-20-2006 8:39:43 | 52568***200301090170 | WIRE CONFIG TEST - W3 OZ 120V | 0.000 | ---- | 0 | 0.025 | ✓ |
| 1-20-2006 8:39:43 | 52568***200301090170 | BLUE PORT CONN - J1 Panel Input | 3.850 | ---- | 0 | 15 | ✓ |
| 1-20-2006 8:39:43 | 52568***200301090170 | SENSOR TEST CONN - J8 SEN A Input | 10.398 | ---- | 0 | 25 | ✓ |
| 1-20-2006 8:39:43 | 52568***200301090170 | SENSOR TEST CONN - J7 SEN B Input | 10.599 | ---- | 0 | 25 | ✓ |
| 1-20-2006 8:39:43 | 52568***200301090170 | FREEZE SENSE CONN - J22 AUX F INPUT | 0.000 | ---- | 0 | 25 | ✓ |
| 1-20-2006 8:39:43 | 52568***200301090170 | SNUBBER TEST - SNBR P1L | 44.000 | ---- | 30 | 65 | ✓ |
| 1-20-2006 8:39:43 | 52568***200301090170 | SNUBBER TEST - SNBR P1H | 46.000 | ---- | 30 | 65 | ✓ |
| 1-20-2006 8:39:43 | 52568***200301090170 | SNUBBER TEST - SNBR P2H | 44.000 | ---- | 30 | 65 | ✓ |
| 1-20-2006 8:39:43 | 52568***200301090170 | SNUBBER TEST - SNBR OZ | 43.000 | ---- | 30 | 65 | ✓ |
| 1-20-2006 8:39:43 | 52568***200301090170 | FIRMWARE - Fault Current | 0.006 | ---- | 0 | 1 | ✓ |
| 1-20-2006 8:39:43 | 52568***200301090170 | FIRMWARE - Compare on J1 | 70 60 05 24 | *706005**24* | 0 | 0 | ✓ |
| 1-20-2006 8:39:43 | 52568***200301090170 | INPUT VOLTAGE - AC_BLK_WHT | 119.640 | ---- | 108 | 132 | ✓ |
| 1-20-2006 8:39:43 | 52568***200301090170 | INPUT VOLTAGE - AC_BLK_RED | 241.430 | ---- | 215 | 255 | ✓ |
| 1-20-2006 8:39:43 | 52568***200301090170 | PUMP1 LO - P1H De-Energized | 4.430 | ---- | 0 | 25 | ✓ |
| 1-20-2006 8:39:43 | 52568***200301090170 | PUMP1 LO - P2H De-Energized | 8.980 | ---- | 0 | 25 | ✓ |
| 1-20-2006 8:39:43 | 52568***200301090170 | PUMP1 LO - P1L Energized | 240.940 | ---- | 216.9 | 265.1 | ✓ |
| 1-20-2006 8:39:43 | 52568***200301090170 | PUMP1 LO - P1L Current | 0.133 | ---- | 0 | 0 | ✓ |

FIG. 6I

TESTING METHOD AND SYSTEM

This application claims the benefit of U.S. Provisional Application No. 60/761,680 filed Jan. 23, 2006, hereby incorporated by reference.

REFERENCE TO A COMPUTER PROGRAM LISTING APPENDIX

An appendix is submitted herewith in the form of a file titled "Test Script Example.txt", created Jan. 23, 2006, with a file size of 36,861 bytes (36,864 bytes on disc), the entire contents of which are incorporated herein by this reference.

BACKGROUND

Spa installations may have sophisticated control systems for controlling operation of the spa heater, pumps, lighting and ancillary systems and equipment. The control systems may include microprocessor systems which interface to various devices through circuit board circuitry. The control system may include a controller circuit board which has mounted thereon a microprocessor as well as discrete circuit elements and controlled devices such as relays and the like.

The controller board may be a circuit system of considerable complexity. Installation of a defective controller board in a controller system can cause considerable difficulty in testing of spa controllers at a manufacturing distribution facility.

Once a spa has been installed at a customer site, and in the case of spa malfunctions, or customer operating problems, a controller board may be replaced in an effort to resolve the malfunction or operating problem. Due to its complexity, there may be difficulties in determining whether the particular controller board is defective. The field technician may replace the board without isolating the problem. Return of allegedly defective controller boards can represent a considerable expense to a spa controller manufacturer. Moreover, determining whether a part is covered by a manufacturer's warranty may be a time consuming project.

BRIEF DESCRIPTION OF THE DRAWINGS

Features and advantages of the disclosure will readily be appreciated by persons skilled in the art from the following detailed description when read in conjunction with the drawing wherein:

FIG. 3 is a simplified schematic diagram of an exemplary embodiment of a multiplexing and load selection system which may be employed to implement functions of a multiplexer and load module included in the system of FIG. 1.

FIGS. 6A-6I are selected exemplary screen shots of displayed images of an exemplary test sequence.

DETAILED DESCRIPTION

Figure 1:
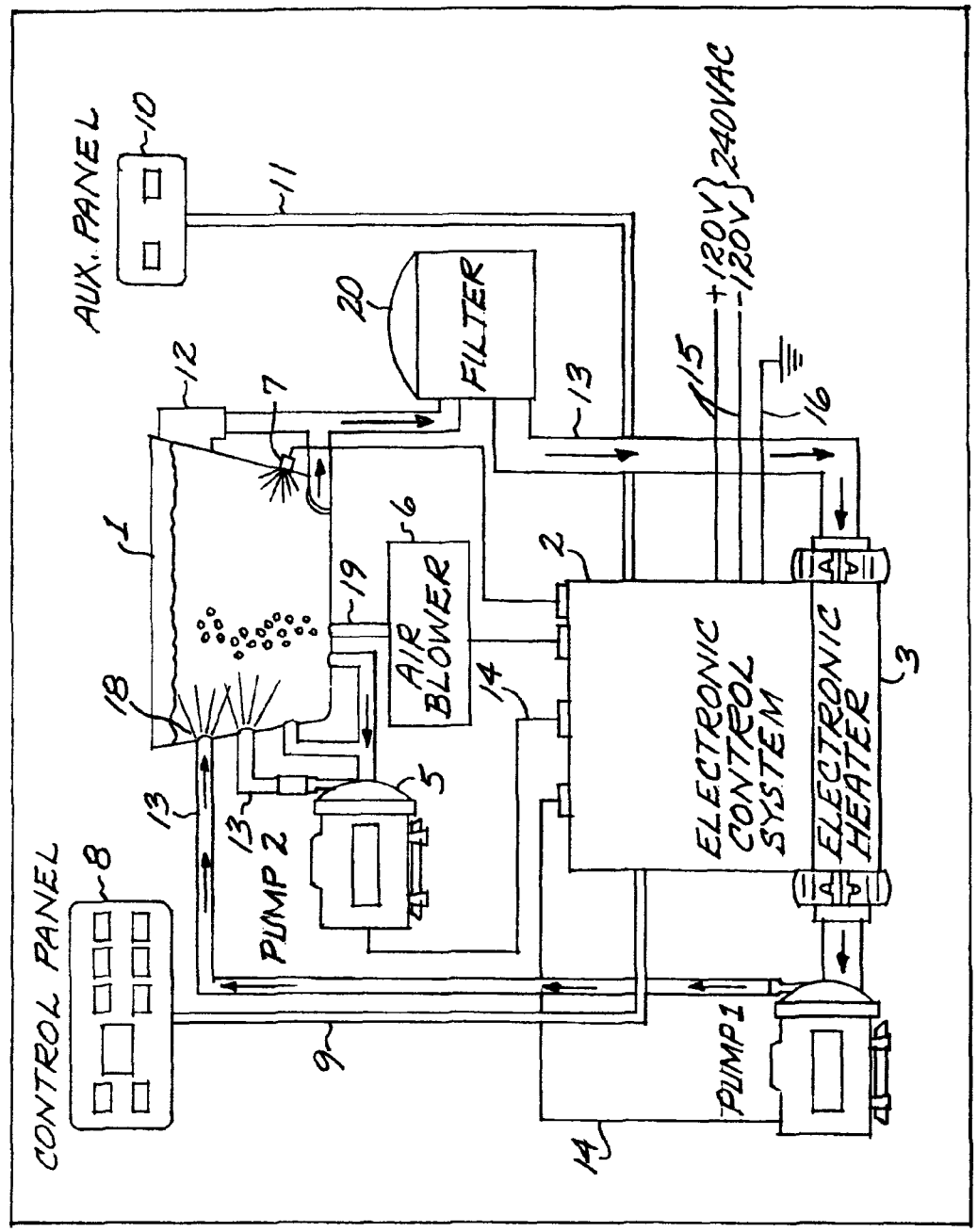
FIG. 1 is a diagrammatic diagram of a spa system with typical equipment and plumbing installed.

In the following detailed description and in the several figures of the drawing, like elements are identified with like reference numerals. The figures are not to scale, and relative feature sizes may be exaggerated for illustrative purposes.

FIG. 1 illustrates an overall block diagram of a spa system with typical equipment and plumbing installed. The system includes a spa 1 for bathers with water, and a control system 2 to activate and manage the various parameters of the spa. Connected to the spa 1 through a series of plumbing lines 13 are pumps 4 and 5 for pumping water, a skimmer 12 for cleaning the surface of the spa, a filter 20 for removing particulate impurities in the water, an air blower 6 for delivering therapy bubbles to the spa through air pipe 19, and an electric heater 3 for maintaining the temperature of the spa at a temperature set by the user. The heater 3 in this embodiment is an electric heater, but a gas heater can be used for this purpose also. Generally, a light 7 is provided for internal illumination of the water.

Service voltage power is supplied to the spa control system at electrical service wiring 15, which can be 120V or 240V single phase 60 cycle, 220V single phase 50 cycle, or any other generally accepted power service suitable for commercial or residential service. An earth ground 16 is connected to the control system and there through to all electrical components which carry service voltage power and all metal parts. Electrically connected to the control system through respective cables 9 and 11 are the control panels 8 and 10. All components powered by the control system are connected by cables 14 suitable for carrying appropriate levels of voltage and current to properly operate the spa.

Water is drawn to the plumbing system generally through the skimmer 12 or suction fittings 17, and discharged back into the spa through therapy jets 18.

A typical spa controller board may include a microcomputer for overall control, as well as various relays, switches, discrete logic, fuses, and connection terminals for connecting to line voltage and to line voltage loads, as well as low voltage connections. Described herein is an exemplary test station and method for testing spa controller board assemblies which are not installed into the spa system. Exemplary applications for the method and system include use by a distributor of portable spa systems, repair depots, and even spa controller board manufacturers.

Figure 2:
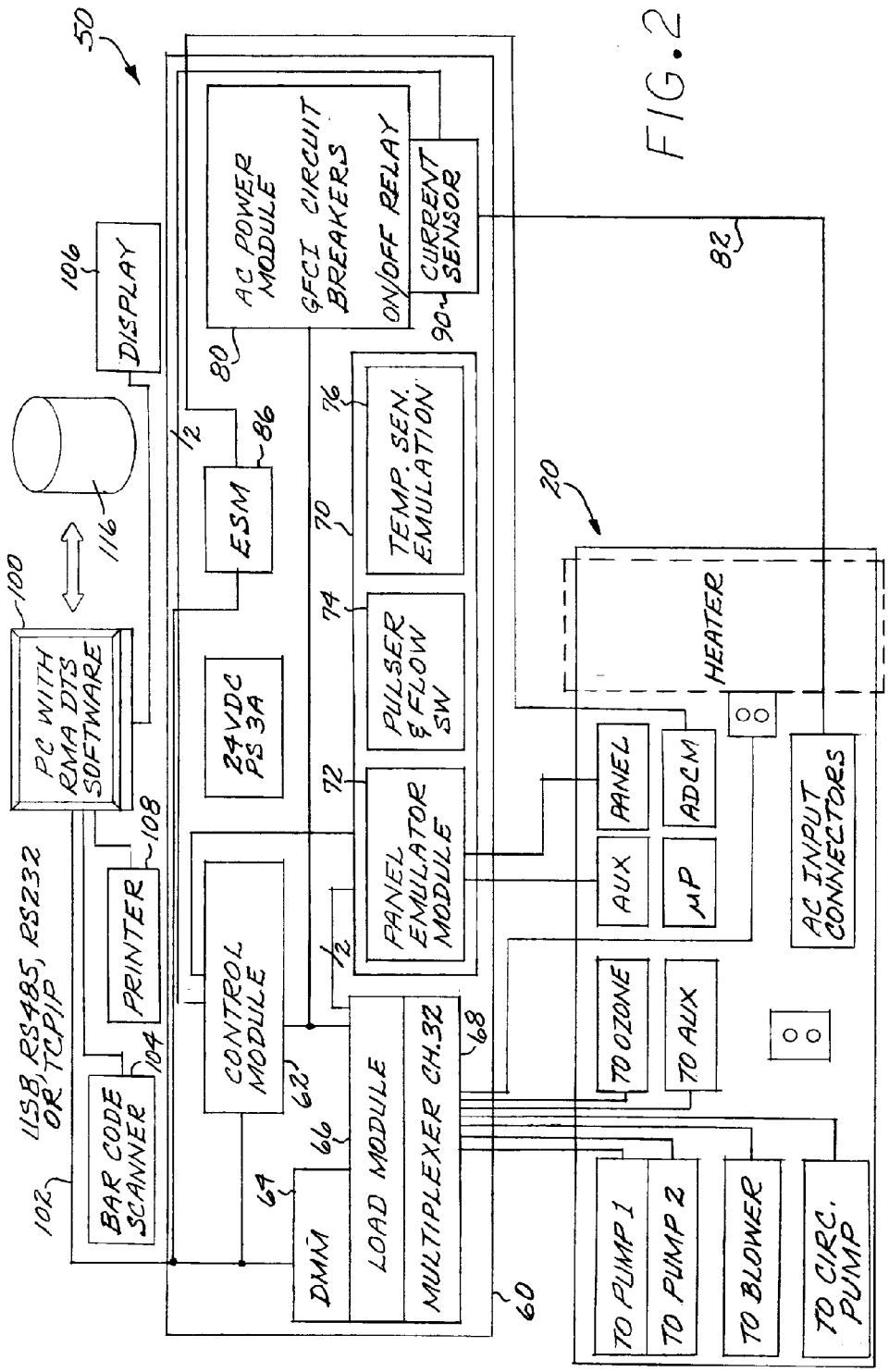
FIG. 2 is a schematic block diagram of an exemplary embodiment of a spa controller board test station.

An exemplary embodiment of a test system 50 for testing a spa controller board assembly 20 is illustrated in FIG. 2. In an exemplary embodiment, the system includes a spa controller board excitation and measurement system 60 including components which may be controlled by instructions received from a controller 100, e.g. a personal computer running a board test software program. The controller 100 may be interfaced to the board excitation and measurement system 60 by an interface 102, which may be, for example, a USB, RS-485, RS-232 or TCPIP (internet) interface. In an exemplary embodiment, a bar code scanner 104 or other input device may be connected to the controller for inputting data. A display 106 controlled by the controller 100 may facilitate the test procedures through display of images associated with a given test setup and test procedure. A printer 108 may be connected to the controller 100 to provide printing capability, e.g. of test results, RMAs, and other records. The controller 100 may be connected to a remote server 116, e.g. through an internet connection, a local area network or by a wireless link.

The system 60 may be electrically connected to a unit under test (UUT) 20, which in an exemplary embodiment may be a spa controller board. In one exemplary application, the UUT may be a previously fielded unit, which may be suspected of having a need for repair. The test system 100 may be utilized, for example, by a spa OEM (original equipment manufacturer), a distributor, or a service center. The controller 100 controls the system 60 to subject the UUT 20 to a test sequence, while measuring parameters such as voltage, current, resistance and capacitance to determine whether the UUT performs to specifications which are stored in a database, e.g. on the controller 100 or a remote server.

An exemplary embodiment of the test system for testing spa controller boards may support one or more of the following features.

- Serial number, item number, item description, manufacturing date, date tested, and defect analysis database tracking and reporting on a local test system.
- Test options for a variety of software revisions and circuit board configurations.
- Certification certificate generated with a passed circuit board or topside panel.
- Test initiation by scan of board serial number, which automatically loads proper test script for the unit under test.
- Test hookup instructions provided in both narrative and visual formats to simplify setup and reduce errors.
- Test will run continuously from initiation, but may provide option for single stepping, or interactive mode, of troubleshooting.
- Printout of failure mode for "no-pass" tested units.
- Script interface may support images of the UUT to assist the operator in finding connectors, switch settings and jumpers by means of a X/Y cross-pointer.
- Software may set current limit trigger set points to protect the operator from over-current conditions (e.g., heater dry fires). Heater test points may have a circuit breaker for added protection. Heater test scripts may have a pre-power resistance test to verify that heater is disconnected prior to applying power.
- Software may provide a virtual panel display to assist the operator with panel type error codes, temperature and output status information.
- Setup server to support remote actions, such as remote updates for test scripts and drawing, test result data file transmission to the manufacturer server for archiving; RMA failure ticket recording.

In an exemplary embodiment, the system 60 includes a control module 62, which converts commands received from the controller 100 via interface 102, a signal measurement module 64, e.g. a voltage/current/resistance/capacitance measurement module such as a digital multi-meter (DMM), which may measures parameters resulting from connecting to the UUT or from exercising the controller functions, a load module 66 which provides a proper electrical load for a given controlled function of the controller, and a multiplexer 68 for channel selection. The measurement results can be digitized, and provided to the controller 100 via interface 102 for processing, storage and comparison against expected signal profiles stored in memory for a given type of unit-under-test (UUT) and for a given test or excitation.

The control module 62 may in an exemplary embodiment include commercially available modules for performing the functions of module 62. For example, the module 62 may include units marketed by CyMod as the CM4530 for USB to RS485 conversion, the CM 4531 for RS485 to RS232 conversion, the CM4056 for digital input/output (I/O) control of the multiplexer 68 and other relay or switch components of module 80, and the CM4017 for analog-to-digital conversion.

Exemplary devices suitable for the purpose of the measurement module 64 are commercially available, such as, by way of example, the model GDM 824 DMM.

In an exemplary embodiment, the system 60 includes a panel and sensor emulator (PSE) module 70 which is connectable through electrical connectors to a set of master panel and auxiliary panel terminals on the spa controller board. The PSE module 70 includes a panel emulator module 72 which may convert instructions received from the controller 100 through the control module 62 into signals emulating signals from a spa master panel and spa auxiliary panel. A test mode signal generator module 74 may generate signals to put the spa into a special test mode for testing heater control functions. A temperature sensor emulator module 76 may generate signals emulating those received from spa heater temperature sensors, in order to test the response of the controller board to a set of temperatures during a heater test mode.

The system 60 further includes, in an exemplary embodiment, an AC power module 80, which provides a line voltage service to the UUT, with a ground fault interrupter (GFCI) and circuit breakers. In an exemplary embodiment, the module 80 may provide a 240 VAC, 30 Ampere service capacity through the GFCI and circuit breaker and an on/off relay system. A line service connection 82 may be established between the module 80 and the AC input connectors of the controller board 20, through a current sensor 90. The current sensor signals are provided to the control module 62 for processing, e.g. analog-to-digital conversion, and provided to the controller. The current sensor 90 may measure the current drawn by the UUT 20 during test procedures.

In an exemplary embodiment, the system 60 may include a voltage level shifting adapter 86 for converting between signal levels of the computer serial port, e.g. RS-232, and SPI protocol TTL signal levels which are compatible with the microcomputer comprising the spa controller board. In an exemplary embodiment, the adapter module 86 can include a MAX 232 RS-232 driver receiver device, marketed by Maxim, or an equivalent, for performing the level shifting. For some applications, the adapter 86 may be omitted, e.g. in a design in which the TTL conversion is performed on the spa controller board, and RS-232 signals are communicated between the test station controller 100 and an RS-232 port on the spa controller board. A serial data stream can be passed between the controller 100 and the spa controller board, allowing data and commands to be passed from the test system controller 100 to the spa controller board 20, and for status and other data to be passed from the spa controller board to the controller 100.

FIG. 2 schematically illustrates features of an exemplary embodiment of a spa controller board 20 which may include a controller printed circuit board, having a conductor pattern formed thereon and populated by various components, which may include, for example, relays, terminal blocks, dip switch blocks, and a microcomputer. The spa controller board can employ power and signal routing features as described in pending application Ser. No. 10/677,510, entitled Controller System for Bathing Installation, filed Oct. 2, 2003, the entire contents of which are incorporated herein. In an exemplary embodiment, the microcomputer may be a PIC 18F6620 microcomputer, although other microprocessors can alternatively be employed. The spa controller board 20 may also include a serial data bus or ADCM (advanced diagnostic control and monitoring) port which may be connected to the test station controller 100 through the level shifting module 86. In an exemplary embodiment, the port may provide full duplex serial data bus connections allowing signals to be passed in both directions simultaneously between the controller and the controller 20. The terminals of the ADCM port may be coupled to terminals of the microcomputer, e.g. through buffer circuits well known in the art.

The controller 2 in an exemplary embodiment may include DIP switch assemblies, or virtual DIP switches, which can be set at the factory or by a service technician to setting indicative of settings of the controller or a particular configuration of the spa 1. The DIP switch settings can be read by the spa controller board microprocessor, and can be passed to the test station 50 through ADCM (advanced diagnostic control and monitoring) port during a test of the spa controller board.

Data can therefore be exchanged between the spa controller 2 and external systems such as the test station controller 100. In an exemplary embodiment, the data can be in the form of data packets of a predetermined protocol. Further details concerning an exemplary protocol are described in co-pending application Ser. No. 10/815,556, filed Mar. 31, 2004, entitled Method and System for Testing Spas, the entire contents of which are incorporated herein by this reference.

FIG. 3 is a simplified schematic diagram of an exemplary embodiment of a multiplexing and load selection system 150 which may be employed to implement functions of multiplexer 66 and load module 68 of FIG. 1. An instrument select relay set 152 may be employed to allow selection of one of multiple measurement instruments for signal measurements. For example, the relay set 152 may allow selection of a DMM (digital multi-meter) 64 or another instrument 64A, such as for example, an oscilloscope.

The system 150 includes a relay control module 156 which controls the various relays or other types of electronically controllable switching devices which perform the switching functions in system 150. In this exemplary embodiment, the relay control module may energize relay coils, e.g. relay coil 158 which actuates relays 152, or relay coil 160, which actives a set 154 of crossover relay set 154 or relay coils 164, 166, 168 which activate load select relay set 170. In an exemplary embodiment, the relay control module 156 is controlled by signals received from the control module 62, which in turn is controlled by the computer 100. The computer 100 may therefore control all relay functions of the system 150. in an exemplary embodiment, the relay control module is a digital control unit connected to an external RS 485 control module 62.

The crossover relay set 154 allows polarity swapping of the signal to be measured. This function may be useful during unpowered active component and DC voltage measurements to increase stability.

A load select relay set 170 performs a function of allowing control over the load impedance to be connected to the unit under test. In an exemplary embodiment, the relay set 170 includes relays 172, 174, 176 which may be closed selectively under control of the relay control module 156 through relay coils 162, 164, 166. The exemplary load impedances selected by these relays includes resistors 178, 180, 182, with corresponding resistance values of 25 ohms, 1 K ohms and 25 K ohms. The relays may be actuated to select individual ones of the resistors, or particular combinations in parallel. In an exemplary embodiment, the load select 170 allows selection of loads to facilitate stable measurements on signals while drawing relatively low load currents. The particular channel and unit under test will determine which impedance value is to be used as a load for a given measurement. This test program running on the pc will typically select the load impedance for a given measurement. Alternatively, the system supports connecting actual load devices, e.g. pumps, as load devices.

The system 150 also includes a test point input channel select multiplexer 190, which may perform functions of the multiplexer 66 (FIG. 2). In an exemplary embodiment, the multiplexer 190 includes a high ("Hi") channel set of 32 relays, for selecting one of the 32 channels, and a "low" ("Lo") channel set of 32 relays, for allowing selection of 32 independent Hi/Lo inputs for measurement. This allows selection of any one of the 32 Hi channels and any of the 32 Lo channels. The relays 192, 194 allow the controller 100 to control, through the control module 62 and the relay control module 156, the particular inputs for measurement.

Figure 4:
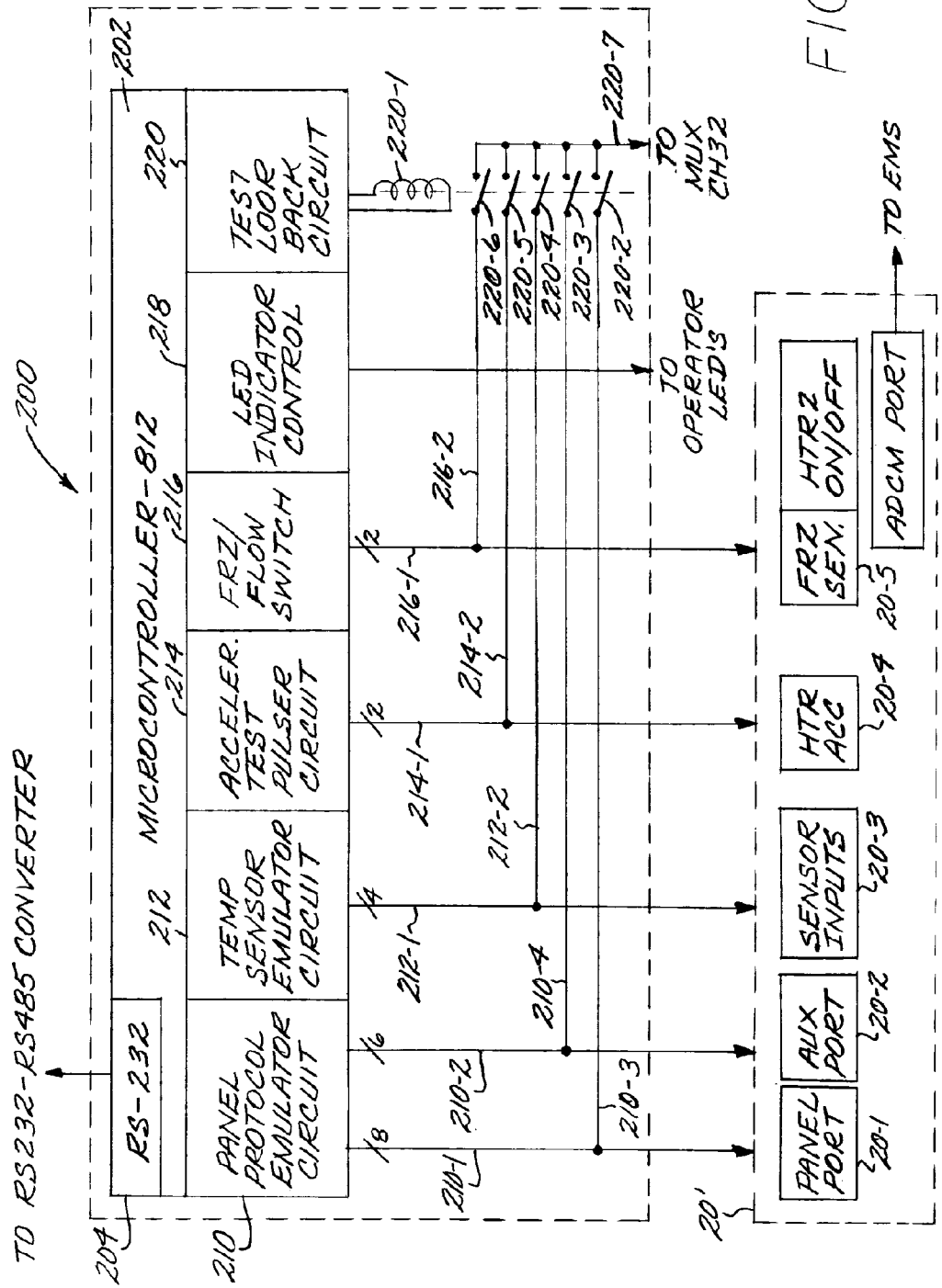
FIG. 4 is a simplified schematic block diagram of a panel and sensor emulation system which may implement functions of the PSE module of FIG. 1.

FIG. 4 is a simplified schematic block diagram of a PSE system 200 which may implement functions of the PSE module of FIG. 2. The system 200 includes an RS232 communication interface 204, which communicates with an RS232-RS 485 converter in the control module 62. A microcomputer 202 decodes commands received from the computer 100, and provides overall control of the system 200. The system 200 includes a panel protocol emulator circuit 210 which in an exemplary embodiment provides functions of synchronizing in real time with the data stream for panel command and display used on the UUT 20'. In an exemplary embodiment, the circuit 210 may be capable of emulating a plurality of different protocols, so that the system may be used for more than one type or model of UUT. In an exemplary application, the UUT may include a panel port 20-1 and an auxiliary panel port 20-2, for connection via cables 210-1, 210-2 to a spa control panel and an auxiliary control panel. During the test procedure, these ports may be connected to the test system 50, and in the exemplary embodiment of FIG. 4, to the PSE system 210.

The system 200 further includes, in an exemplary embodiment, a temperature sensor emulation circuit 214, which is connectable to sensor terminals 20-3 of the spa controller board 20' under test by cable 212-1. The circuit 214 simulates water temperature signals on the sensor terminals. In an exemplary embodiment, the spa controller board has terminals for receiving temperature information from two temperature sensors, e.g. one located on the water input to the spa water heater, and a second one located on the water output from the spa water heater. In this example, the circuit 214 simulates temperature signals for the two temperature sensors over a temperature range. In an exemplary embodiment, the circuit 214 is controllable to simulate temperatures from 30 degrees F. to 120 degrees F. The temperature simulation may be useful, for example, for spa heater turn-on testing and over heat (OH) safety circuit testing.

The PSE system 200 in an exemplary embodiment may include an accelerator test pulser circuit 214, which allows the computer 100 to accelerate testing of the heater and ozone outputs on some spa controller boards. This can save some time in testing cycles. The circuit 214 is connectable to the spa controller board heater accelerator terminals 20-4 by cable 214-1. By reception of a special signal, e.g. an 11 Hz low voltage square wave signal, a specially designed spa controller board may be placed into a special test mode, to allow the accelerated heater testing mode to be performed.

The system 200 may include, in an exemplary embodiment, a flow switch simulation circuit 216, which simulates the function of a water flow switch and a freeze detect signal in an exemplary spa system. The circuit 216 is connectable to the UUT by cable 216-1, e.g. to freeze sensor and heater on/off terminals 20-5. Some spa controller boards may be designed to accept a water flow switch output signal as an indication of water flow through a circulation path, and to turn off a heater if no flow is detected. Some spa controller boards may be designed to accept a freeze sensor output signal as an indication of a freeze condition which may be addressed by turning pumps and heaters on.

The system 200 may also include an LED indicator control circuit 218 which is connectable to operator LEDs located next to the test cable input terminals on the tester housing. These LED indicators may assist the operator to identify the proper cable connections prior to starting a test.

In an exemplary embodiment, the system 200 may also include a built-in test loop back circuit 220, which enables the system controller 100 to perform a cable connection test to test for proper connection on test points prior to starting a test. This is intended to minimize test failure because of incorrect setup. The circuit 220 includes a relay set, represented schematically by coil 220-1, and relay switches 220-2 . . . 220-6, connected to cables 210-2 . . . 216-2 on one side of the respective switches and cable 220-7 on the other side of the switches. The cable 220-7 is connected to multiplexer channel 32 of the multiplexer 190 (FIG. 2), to allow per-cable signal measurement through the test cable connections to the UUT. For example, the circuit 220 may activate switch 220-2 to allow signal measurement on cable 210-1 through multiplexer channel 32. This can determine whether the cable 210-1 is properly connected to the UUT, by determining whether an expected signal is measured. Examples of typical pre-power connection measurements may include, in an exemplary embodiment, the following:

1.) AC service connection to board: Measure resistance of UUT transformer to verify power cable is connected. Expected: 45 ohms, +−20%.

2.) AC service voltage setting: Measure resistance of UUT service strapping to verify board is setup correct for 120 or 240 VAC. Expected: <20 ohm for 120 VAC; >20 K ohms for 240 VAC.

3.) Panel port connection: Measure resistance of each button signal input to verify panel cable is connected to UUT and input impedance is correct. Expected resistance: 1M ohms, +−25%.

4.) Freeze input connection: Measure resistance of freeze input to verify test cable is connected to UUT correctly. Expected: 10 K ohms, +−25%.

5.) Sensor A&B input connection: Measure resistance of sensor inputs to verify test cables are connected to UUT correctly. Expected: 20 K ohms, +−20%.

6.) Test point connections: Measure capacitance on each test point output (Ex: Pumps, Blower, etc . . . ) to verify test cables are connected to UUT correctly. Expected Capacitance measurement: 30-60 ufd.

Figure 4A:
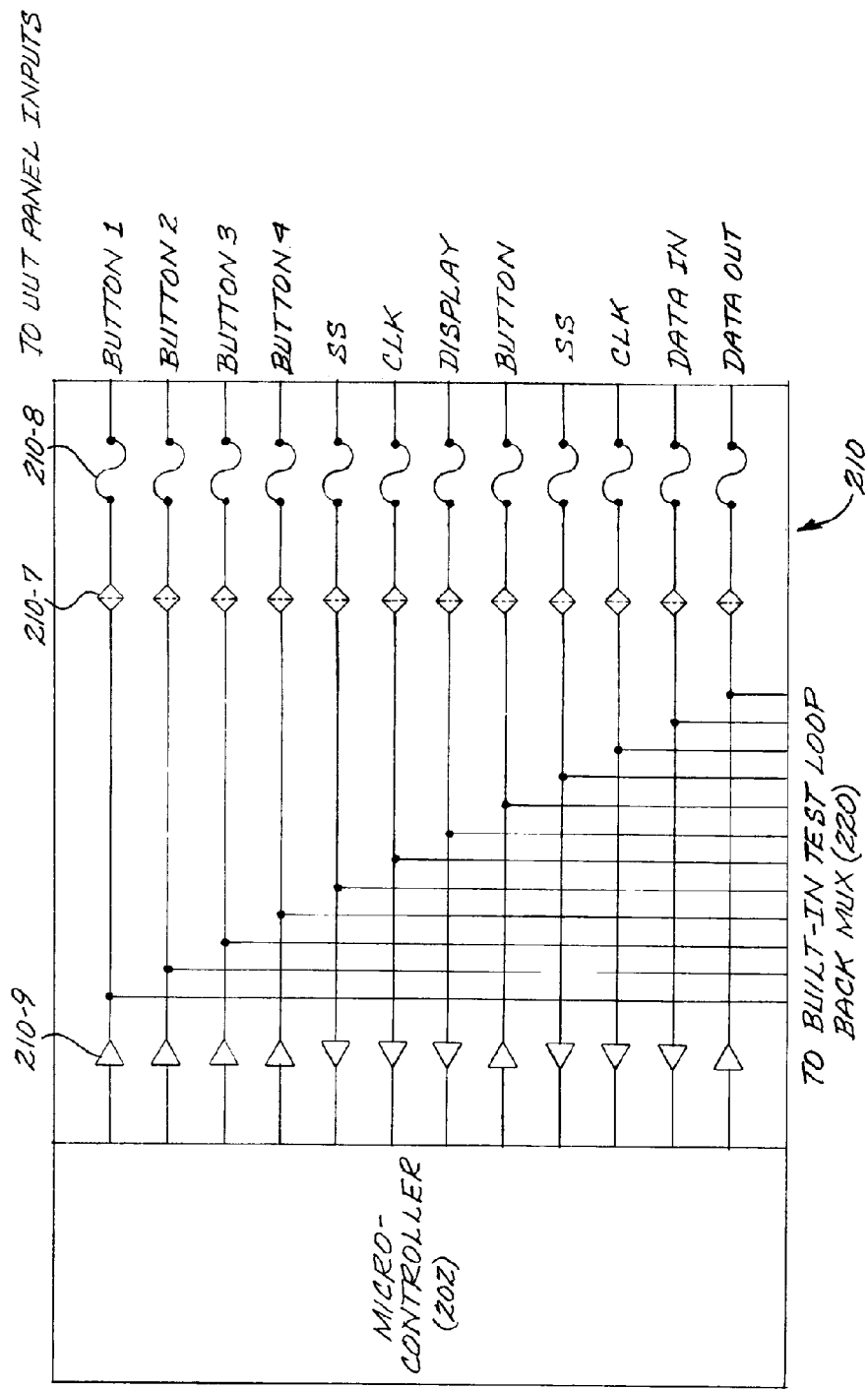
FIGS. 4A-4E are schematic diagrams of respective circuits of the system of FIG. 4.

FIGS. 4A-4E are schematic illustrations of exemplary embodiments of the respective circuits 212-220. Referring to FIG. 4A, an exemplary panel protocol emulator circuit 212 is depicted. In an exemplary embodiment, the emulator circuit 212 may synchronize in real-time with the data stream for panel command and display used for the spa controller board under test. In an exemplary embodiment, the emulator circuit 212 may be adapted to handle the data stream for a plurality of types of spa controller boards, and the particular data stream for the UUT may be selected from one of a plurality of protocols stored for use by the controller 100. In an exemplary embodiment, the circuit 212 may be adapted to allow for automated testing of the UUT without requiring the operator to install and operate a test panel. Thus, for an exemplary embodiment, the circuit may simulate control panel protocols to perform automated commanding and display functions. The embodiment illustrated in FIG. 4A is connected to terminals of the microcomputer 202 of the circuit 200 through a buffer, e.g. buffer 210-9, and is protected by clamp and resettable fuse components, e.g., clamp 210-7 and fuse 210-8. If an over voltage condition occurs on any input or output the resettable fuse will open and protect the circuit. When the over voltage condition is removed, the circuit may automatically reset for normal operation without operator service. Exemplary UUT panel button and port connections are illustrated in FIG. 4A, as buttons 1-4, etc. Signals are also connected to the test loop-back multiplexer circuit 220, so that proper connection to the UUT panel terminals.

Figure 4B:
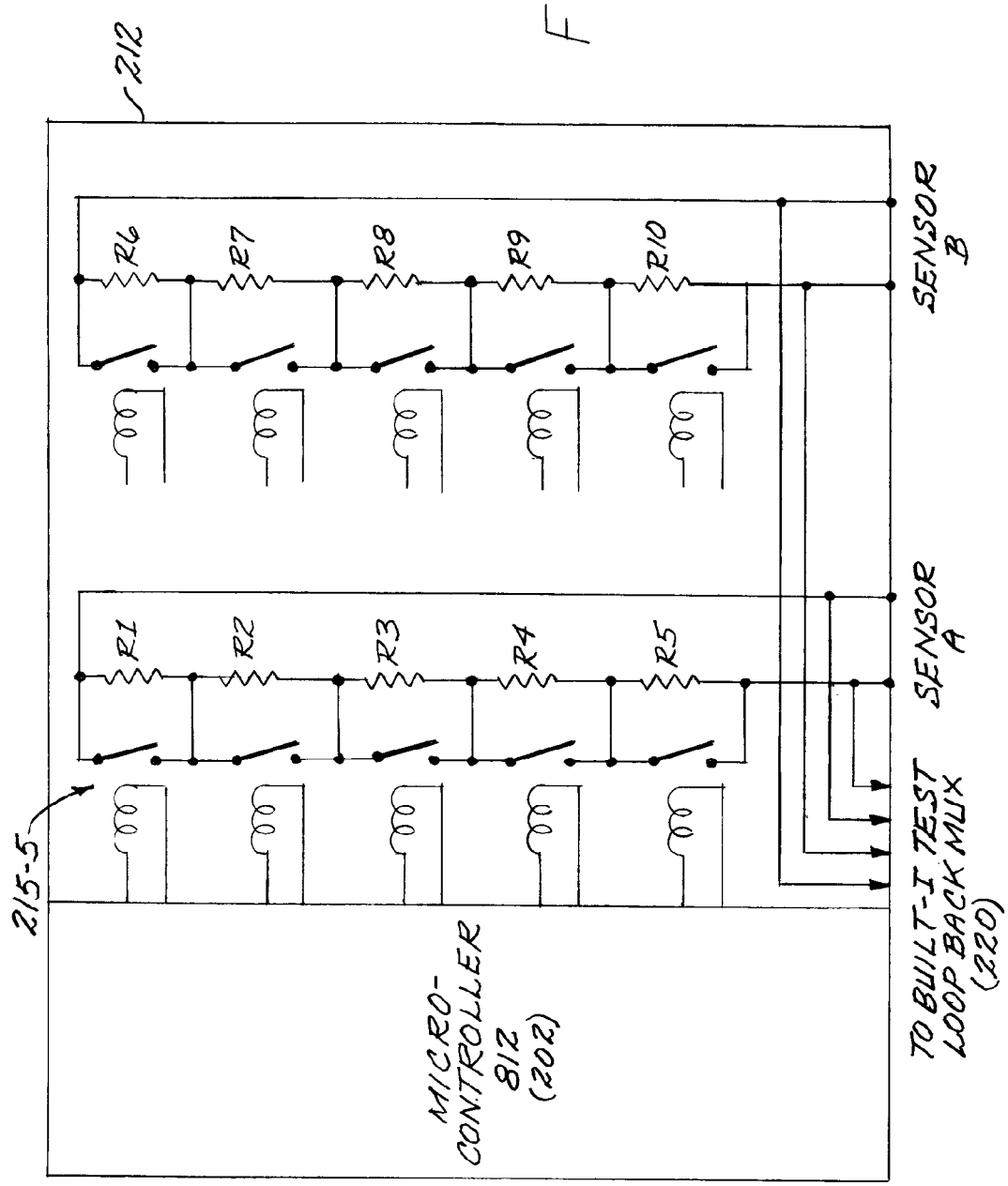

FIG. 4B depicts a schematic diagram of an exemplary temperature sensor emulator circuit 212. Typically the temperature sensor used in a spa may be a variable resistance device, with the resistance indicating the sensed temperature. This circuit is controller by the microcomputer 202, and includes several resistors connected in series ladder arrangements between ports to be connected between the temperature sensor terminals. In this embodiment, there may be two sensors, sensor A and sensor B, connected to the spa controller board. Each resistor may be bypassed (shorted) by a relay, e.g. relay 212-5 to affect the series resistance connected between the respective sensor terminals by the respective resistor ladder. Thus, series combinations of different ones of the resistors, e.g. resistors R1-R5, may be selected by appropriate control of the respective relays, to simulate different temperature values presented to the UUT. In an exemplary embodiment, the temperature sensor emulator circuit 212 may simulate water temperatures on the A and B inputs, controllable between 30 degrees and 126 degrees F. The temperature sensor emulator circuit may be used for heater turn-on testing and Over Heat (OH) safety circuit testing. Signals may also be connected to the test loop back multiplexer circuit 220 for self-test of the signals and pre-power connection testing on the UUT.

Figure 4C:
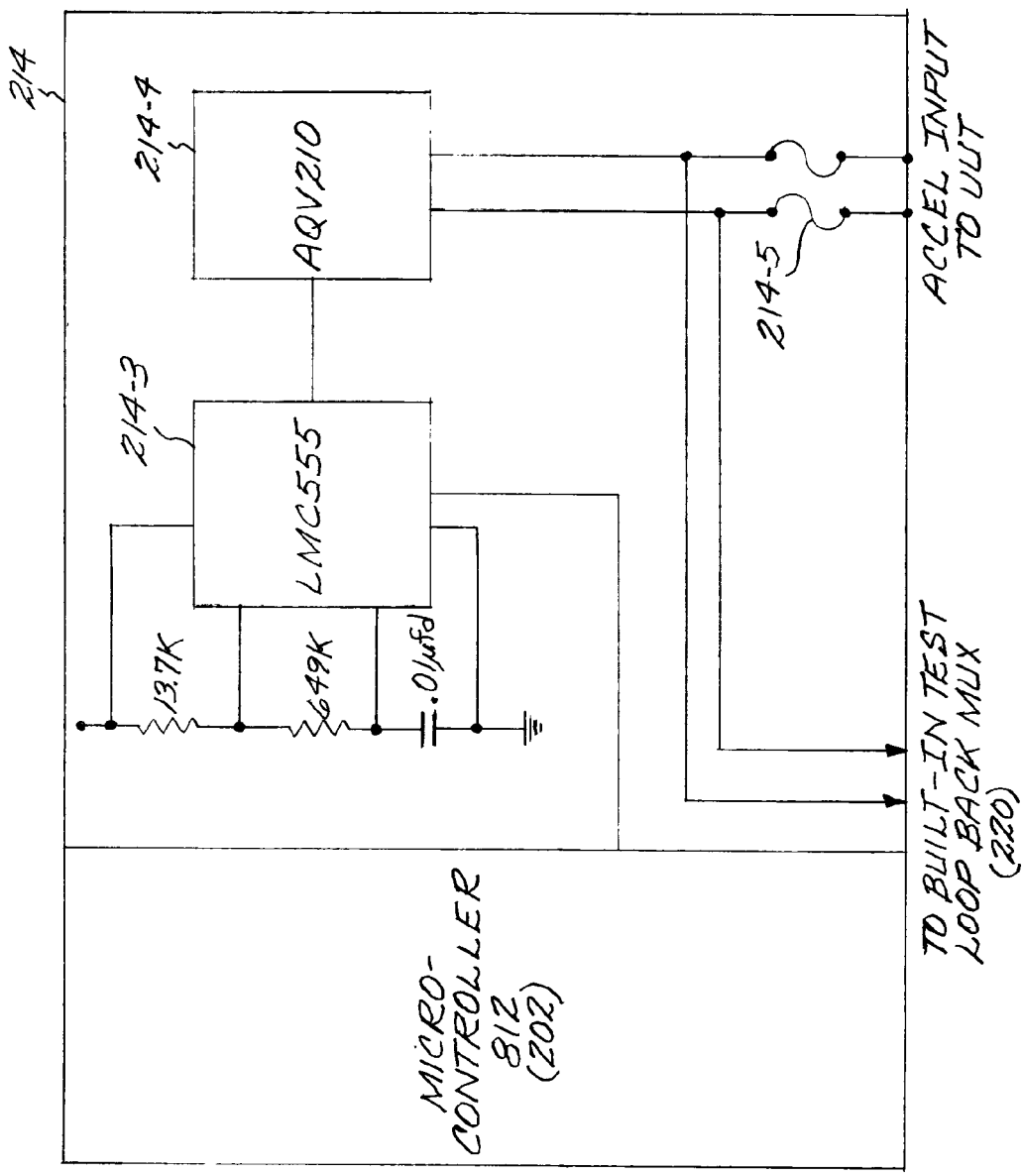

FIG. 4C depicts a schematic diagram of an exemplary embodiment of an accelerated test pulser circuit 214. This circuit may allow the controller 100 to accelerate testing of heater and ozone outputs on some UUTs, saving test time by eliminating wait time for firmware on the controller board (UUT) to turn the heater on. In an exemplary type of spa controller board, for example, accelerated testing operation may be facilitated through a special test input on the UUT. When the UUT senses an 11 Hz pulse on its ACCEL Input at power up of the UUT, the UUT will automatically toggle the heater/zone outputs on then off. After the heater and ozone circuits are tested through this feature, the accelerated test mode is disabled. In this exemplary embodiment, an LMC555 timer 214-3 is configured to generate an 11 Hz pulse. This signal then drives an AQV210 solid-state switch 214-4 used to isolate the timer from the UUT. The switch may further be protected by use of resettable fuses 214-5. The signals are also connected to the test loop back multiplexer 220 for self-test of the signals and pre-power connection testing on the UUT.

Figure 4D:
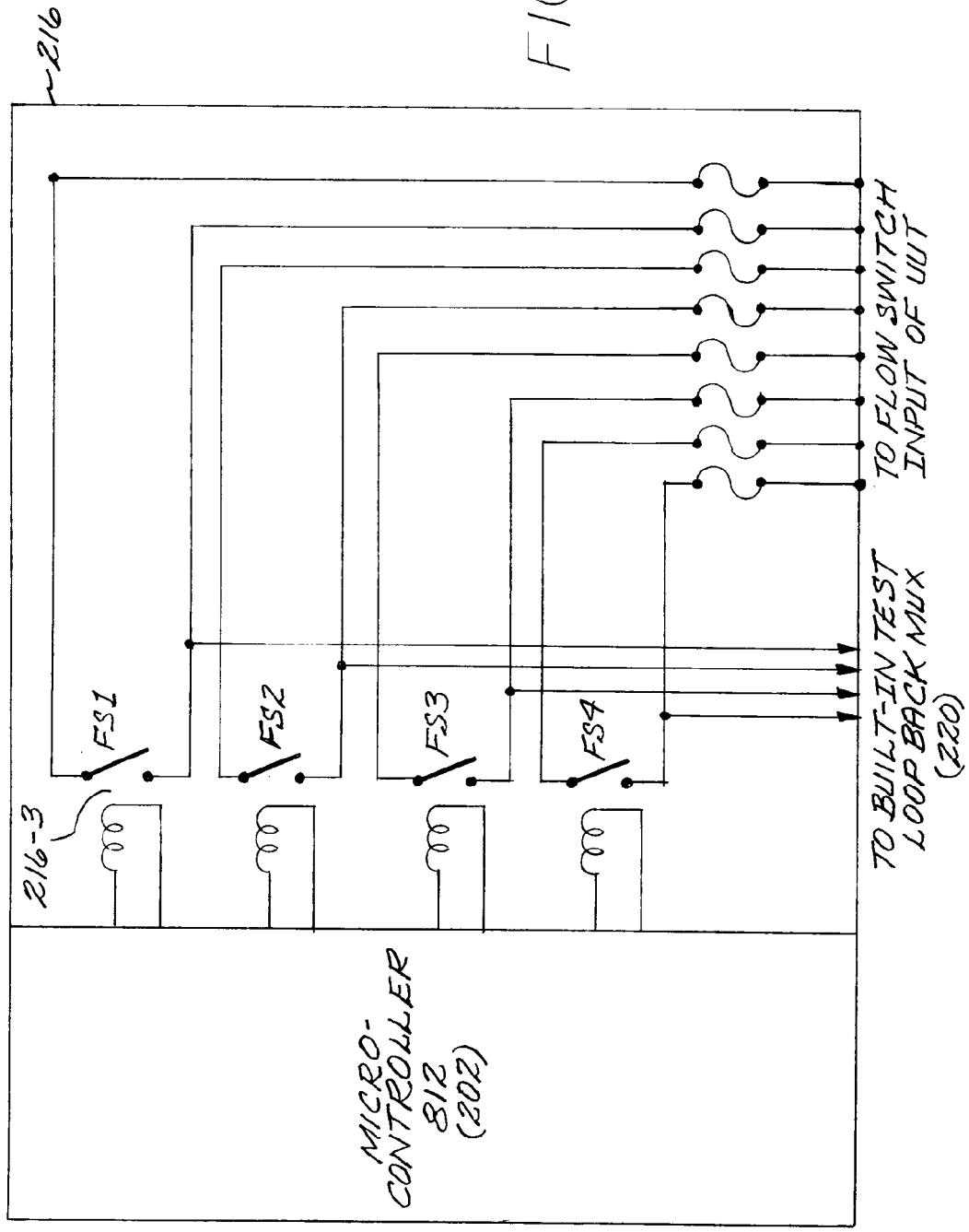

FIG. 4D illustrates a schematic diagram of an exemplary embodiment of a freeze detector/flow switch emulator circuit 216. This circuit may simulate the function of the flow switch and freeze detect signals, which may be connected to the spa controller board. This exemplary circuit may simulate up to four independent switch controls during UUT testing, each by control of a relay switch such as 216-3 by the microcomputer 202, which may connected to the flow switch or freeze sensor inputs of the UUT. The signals may also be connected to the test loop back multiplexer circuit 220 for self-test of the signals and pre-power connection testing on the UUT.

Figure 4E:
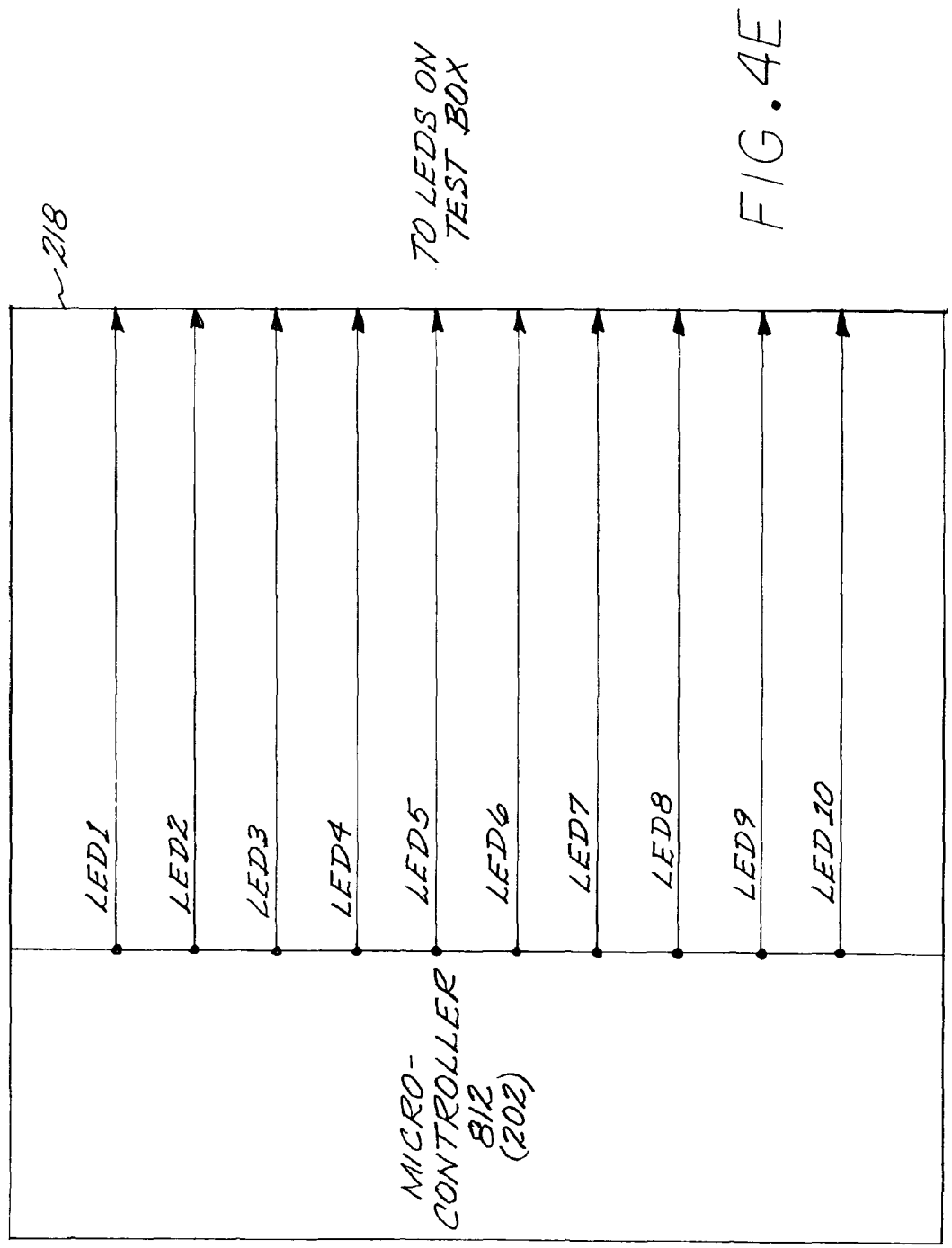

FIG. 4E depicts schematically an exemplary embodiment of a LED indicator control circuit 218, under control of the microcomputer 202. Thus, the microcomputer may control LED indicators mounted on an enclosure for the system 60, next to test cable connectors. The LED indicators assist the operator to identify the appropriate cable connections prior to starting a test.

Figure 2A:
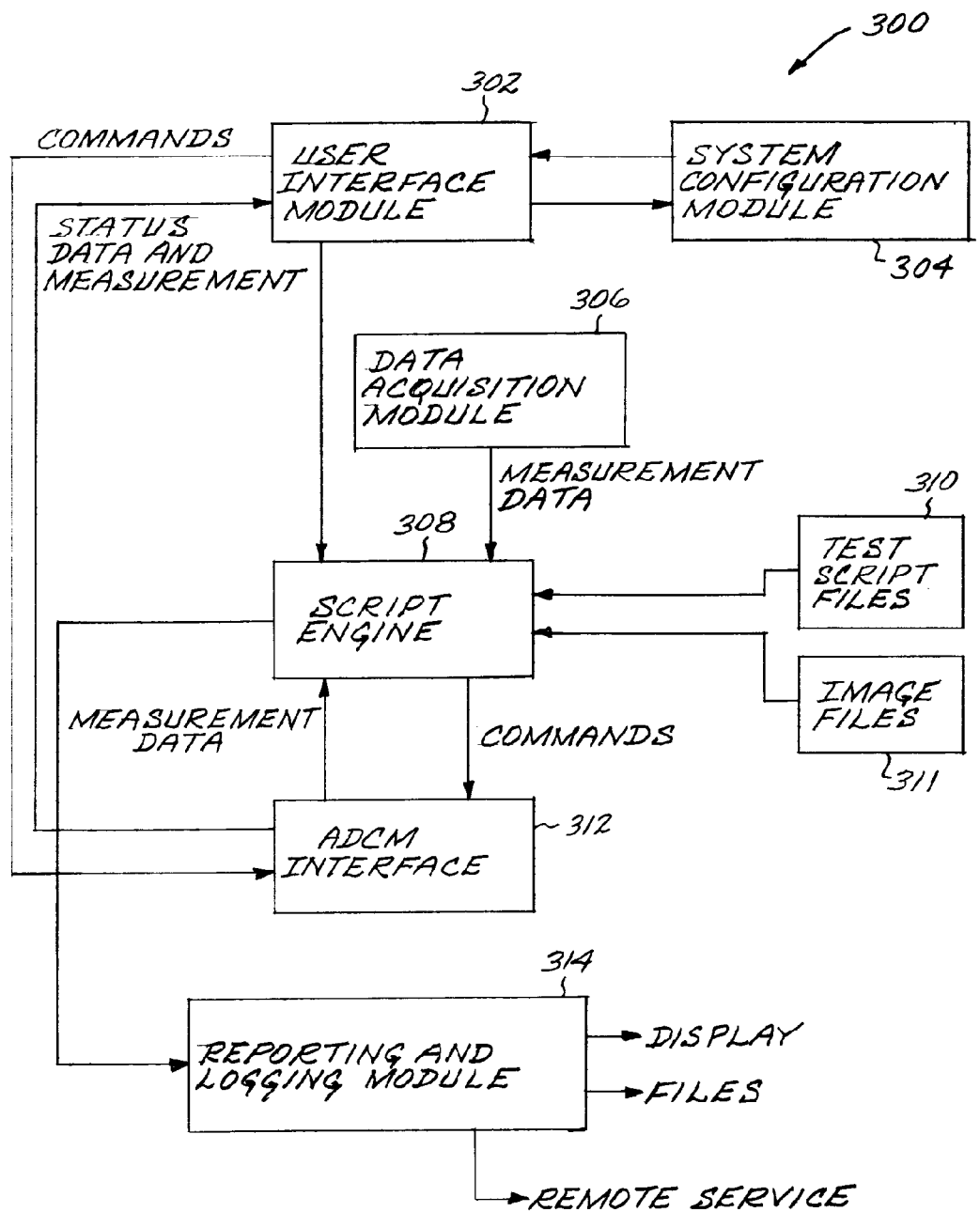
FIG. 2A is a functional block diagram of an exemplary embodiment of a compiled application for executing test scripts.

The test station controller 100 may be programmed with a test algorithm designed to functionally test a spa controller board. In one exemplary embodiment, the test algorithm is defined by test scripts which are run by a compiled Labview™ application installed on the controller 100. Labview™ is a commercially available program, marketed by National Instruments. An exemplary test script is set out in the Appendix set out in the incorporated file Test Script Example.txt. The compiled program processes the test scripts which are designed to perform the test sequences. FIG. 2A is a functional block diagram of an exemplary embodiment of a compiled application 300 for executing the test scripts. The application includes a user interface module 302, which is responsive to user interface devices associated with the controller 100, such as a keyboard, mouse, touch screen, e.g. to process button pushes. The user interface module exchanges data with a system configuration module 304, which stores data regarding the spa system configurations. A software data acquisition module 306 receives data from the module 60, to provide spa current data to a script engine 308. The script engine 308 is a Labview™ interpreter, which interprets and executes the test scripts comprising the test script files 310. The script engine 308 sends commands to an ADCM interface module 312, which formats the commands into appropriate serial data packets sent to the RS-232 serial port of the test computer connected to the adapter 70, and which interprets data from the serial port. The interface module 312 also receives commands from, and sends ADCM data to the user interface module 302. The script engine also provides test data to a reporting and logging module 314, which services the test station display to provide data displayed on the test station monitor, provides test result files, and provides remote services, such as sending test result files to a remote server.

Figure 5:
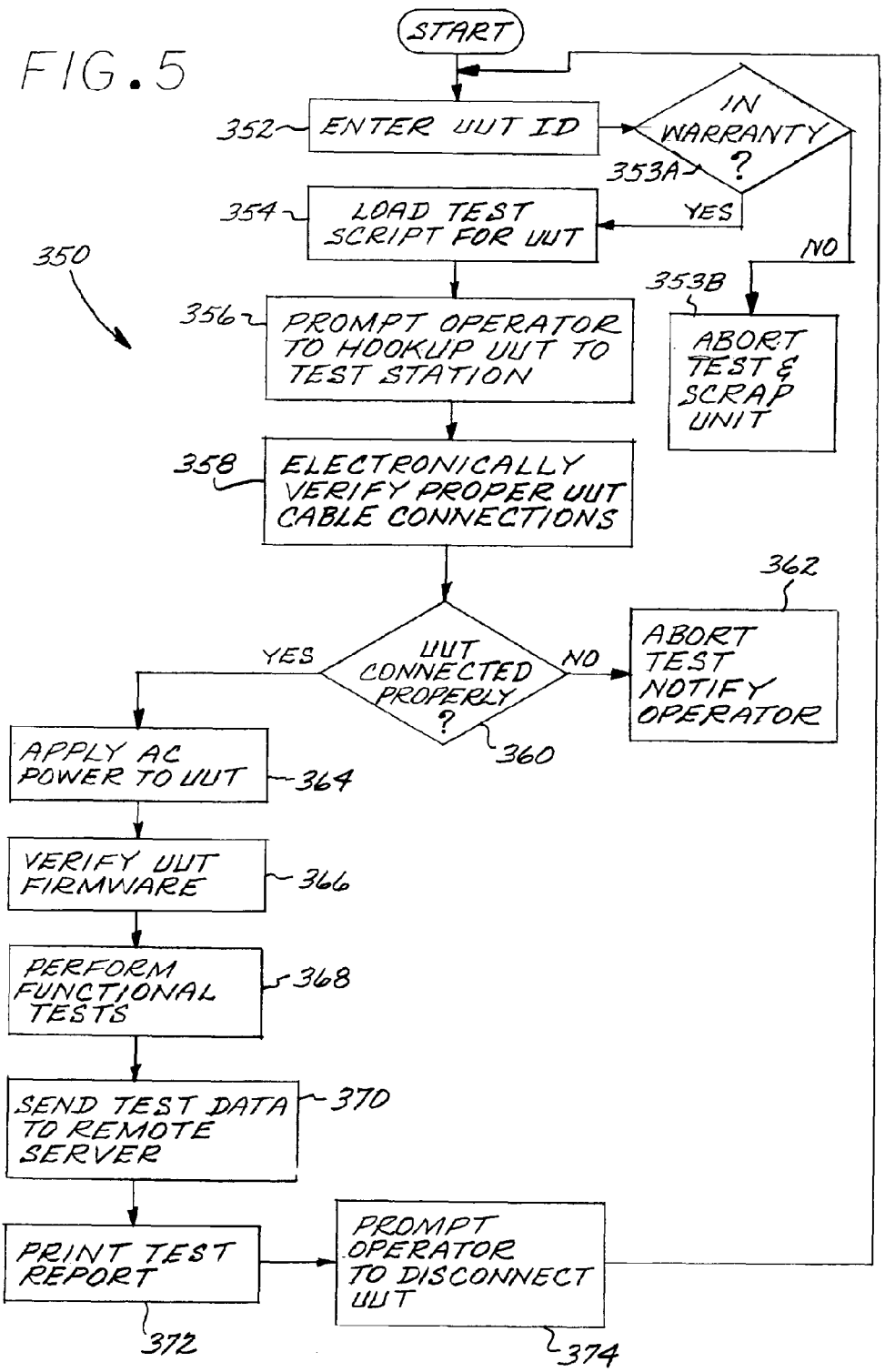
FIG. 5 is a simplified flow diagram illustrating an exemplary embodiment of a test sequence of a spa controller board.

The controller 100 may be programmed to carry out a test sequence on a UUT. FIG. 5 is a flow diagram of an exemplary test algorithm 350 which may be performed by an embodiment of the test system 50. At 352, the test operator is prompted to enter the UUT identification (ID). In an exemplary embodiment, the ID may be entered by scanning a bar code on the UUT with the scanner 104 (FIG. 2). If the unit with the ID is not under warranty at 353A, in an exemplary embodiment, the test may be aborted, and the unit scrapped at 353B. If the unit is under warranty, at 354 the controller may then match the information decoded from the bar code with a test script which is stored in memory for the UUT model or even the particular UUT. The test script, which is loaded, may then control the test sequence for the UUT. At 356, the test system 50 prompts the operator to connect the UUT 20 to the system 60, by cable connections. This prompting may include messages displayed on the display 106, with images of the UUT and the housing for the system 60.

At 358, the system 50 performs an electronic verification procedure to verify that the UUT cable connections have been made properly. This may be done using the test loop back circuit 220 and multiplexer circuit 68, to sequentially connect the connector ports on the system 60 to the DMM 64. For each connection, the expected nominal parameter, e.g. resistance and/or capacitance, may be stored in memory for a proper connection. The actual measured parameter value may be compared against the nominal parameter value to determine if each connection has been properly made. This determination 358 may be made prior to applying AC power to the UUT.

At 360, if the UUT is found to fail the connection, the test is aborted at 362, and the operator may be notified of the suspected failure cause, e.g. which connection was found to be improperly made. Otherwise, if the UUT is properly connected to the test station, then at 364, AC (and low voltage, if required for a particular UUT) power may be applied to the UUT, by actuating relays in the module 80 (FIG. 2). With the UUT powered up, for some types of UUTs, the firmware version of the UUT may be (optionally) read at 366 using its ADCM port, and verified against the version expected as a result of the ID entered at 352. The system 50 then performs functional testing of the UUT at 368. The test data may be sent to a remote server at 370. A test report may be printed at 372. At 374, the operator is prompted to disconnect the UUT from the system 50, and operation returns to 352 to commence another test operation.

An exemplary embodiment of a test sequence is set out below.

Figure 6A:
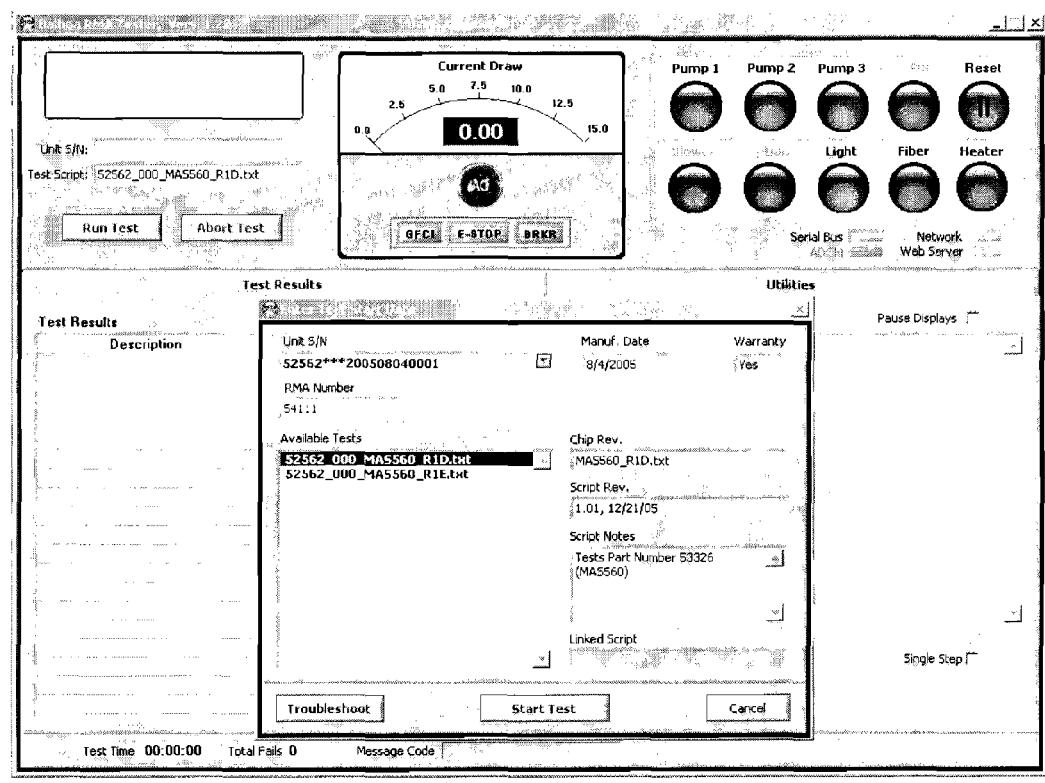
Figure 6B:
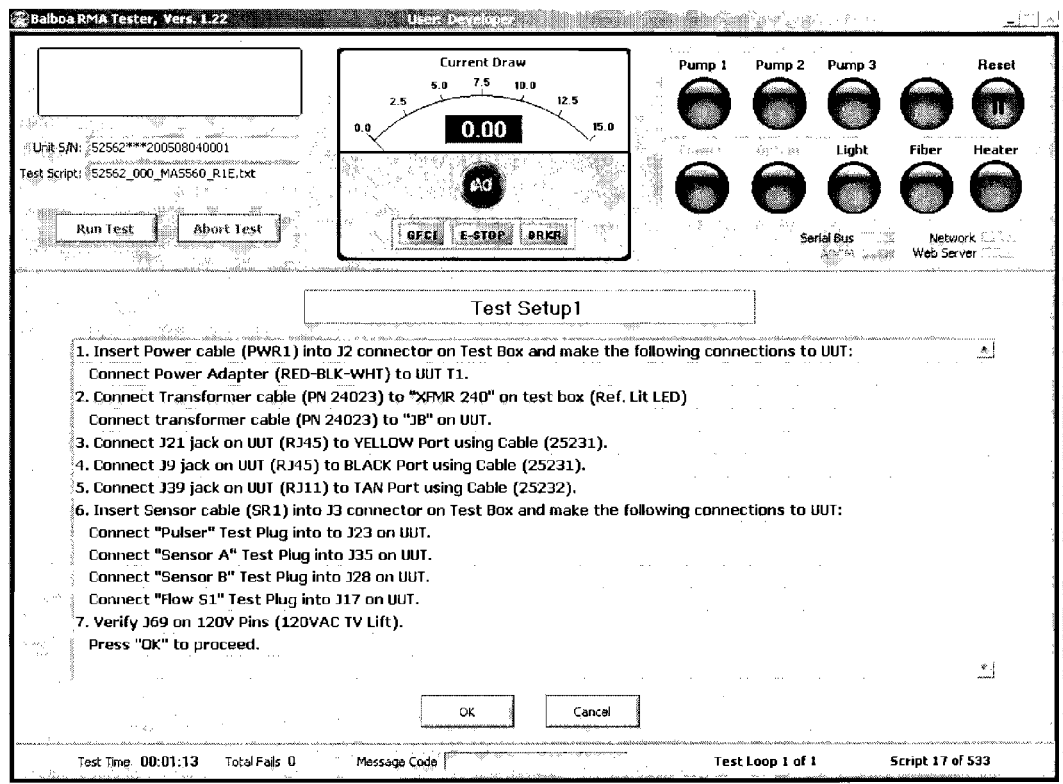
Figure 6C:
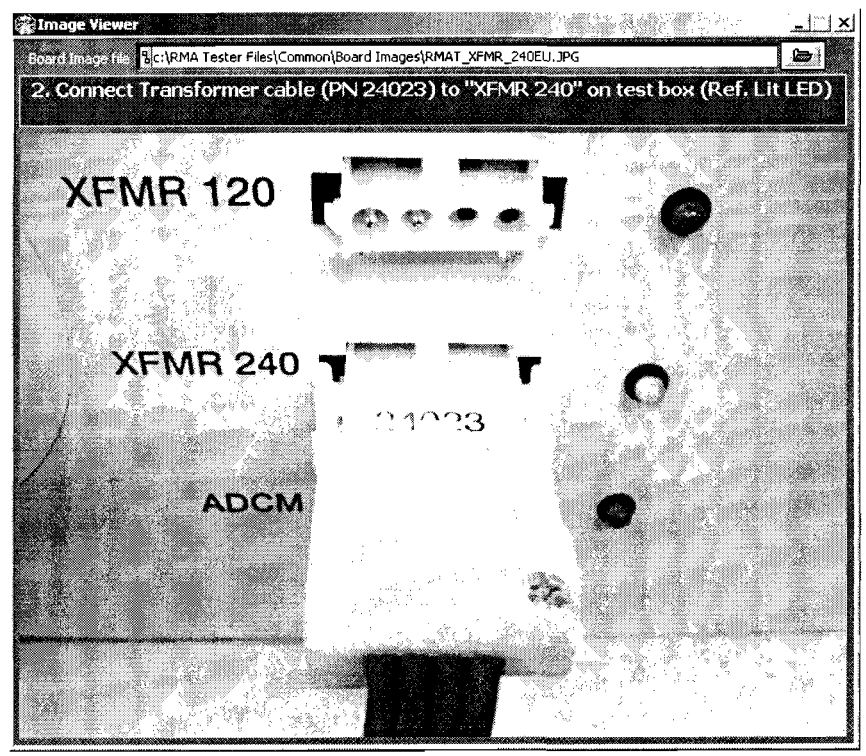
Figure 6D:
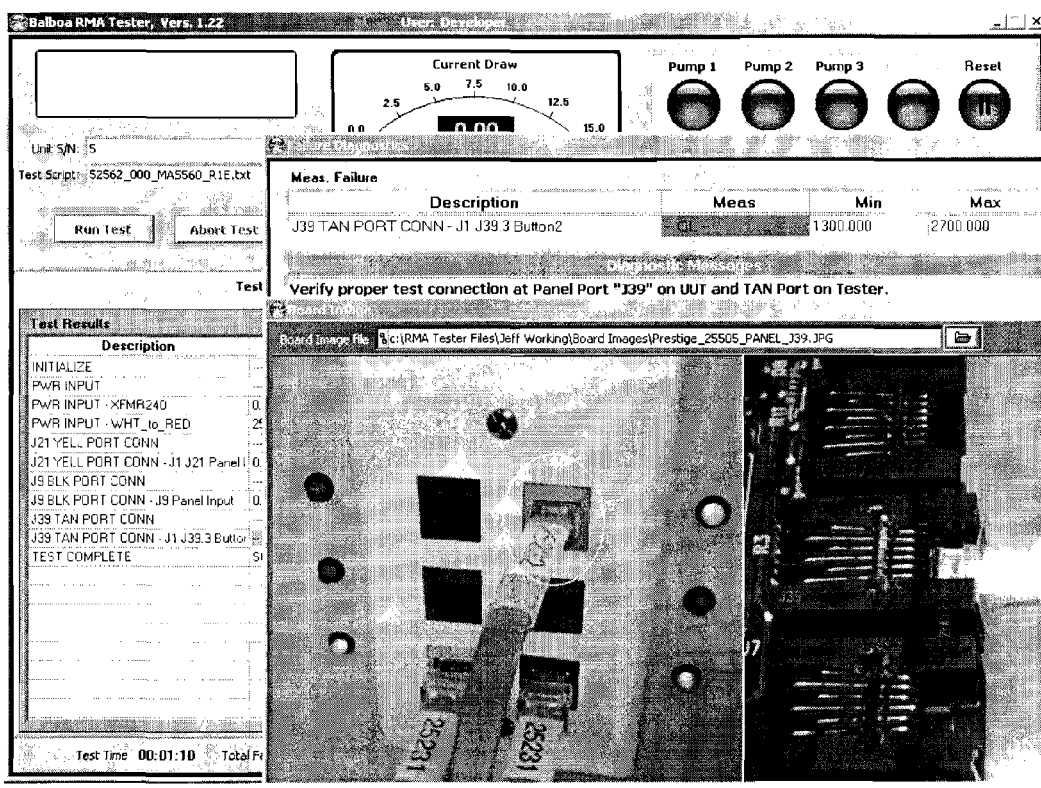
Figure 6E:
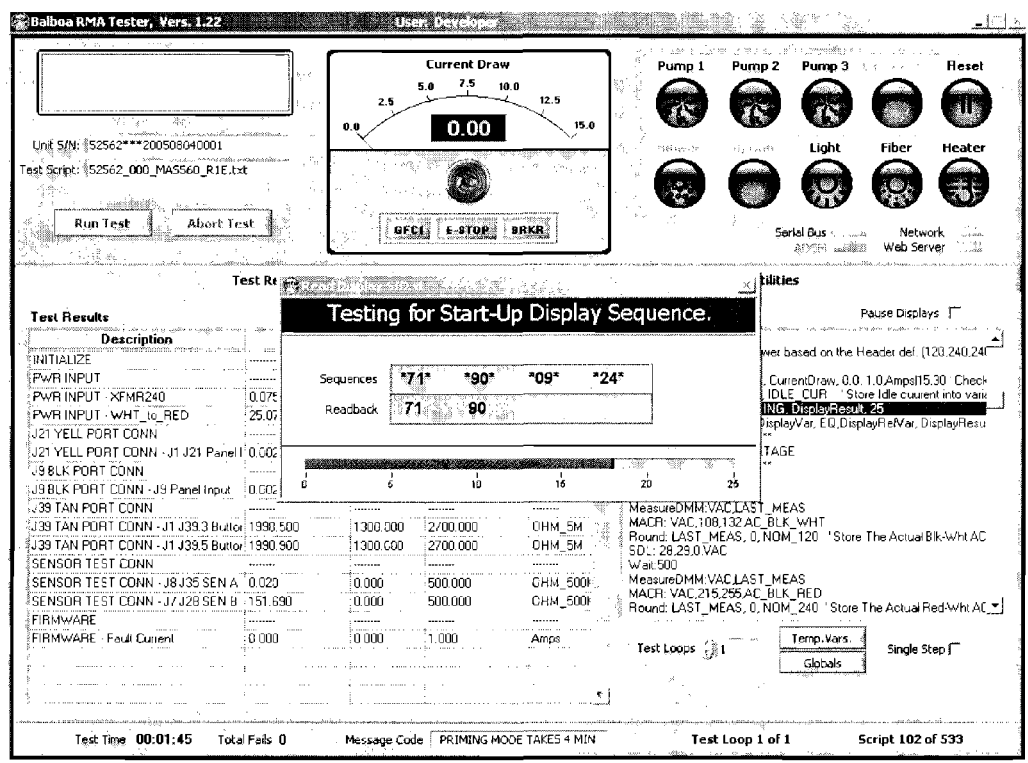
Figure 7:
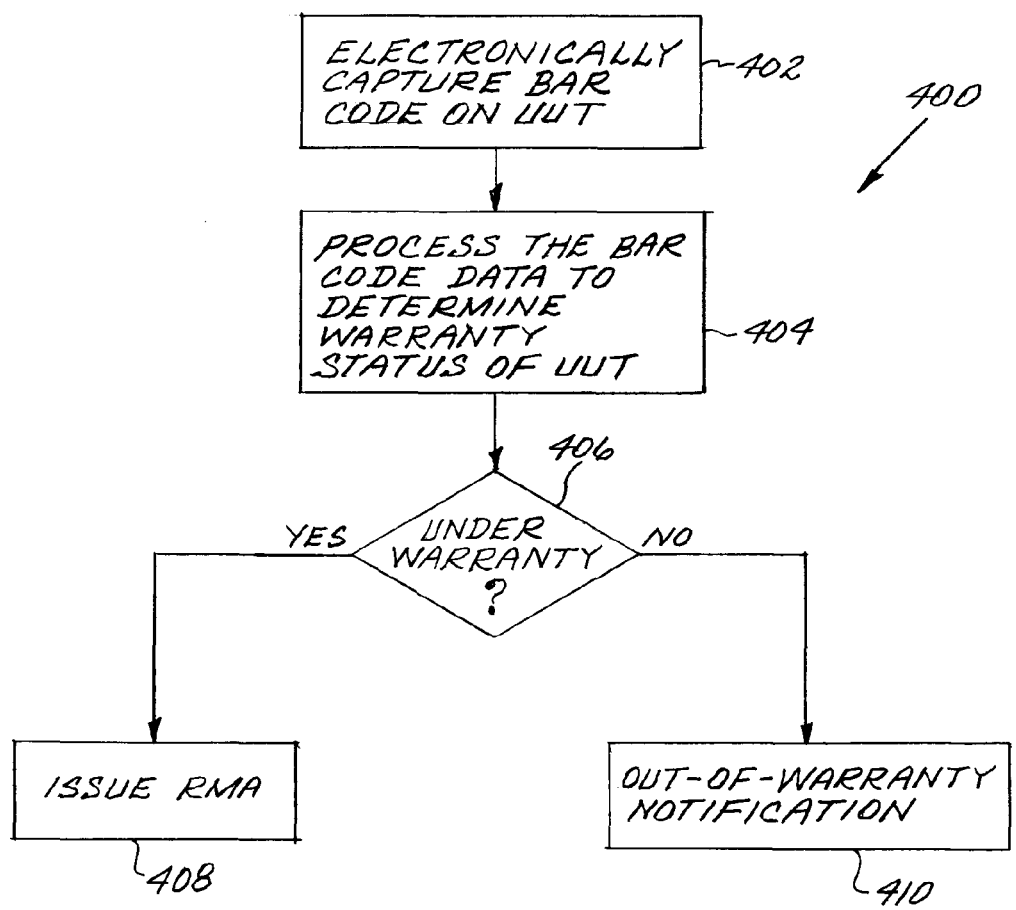
FIG. 7 is a simplified flow diagram illustrating an exemplary method for establishing warranty status of a device such as a spa controller board.

1.) Operator prompted to scan in UUT barcode.
2.) Operator scans barcode, controller will then load correct test script. FIG. 6A is an exemplary screen shot generated from a Labview™ application programmed to perform the algorithm of FIG. 5, showing an exemplary unit serial number captured by scanning the UUT barcode and the available test scripts. The test sequence depicted in FIG. 5 may also indicate to the operator whether the UUT is in warranty, based on an algorithm illustrated in FIG. 7.
3.) Start Pre-Power Test:
4.) Operator follows instructions on proper hookup for UUT. FIG. 6B depicts an exemplary screen shot showing an exemplary set of instructions for connecting the UUT to the test system. FIG. 6C depicts an exemplary screen shot of an image of exemplary test station connectors and LED indicator lights. In this example, depicted therein is the AC power cable for connection to the AC connectors of the test station housing.
5.) Impedance tests to verify proper cable connections.
6.) If all connection tests pass, continue with power-up. If any pre-power test fails then abort test and give operator description of failed test and possible causes for fail. FIG. 6D depicts an exemplary screen shot image showing an exemplary failed panel connection.
7.) Start Powered Functional Test:
8.) Apply AC power to UUT.
9.) Verify correct firmware installed input UUT. FIG. 6E is an exemplary screen shot image depicting an outcome of a firmware ID test. At power up the UUT may display or output on the ADSM port or on the panel display a series of codes that is tested to verify that the correct firmware revision has been installed into the UUT. The code or series of codes may include, for example, a system software identifier (SSID), which in an exemplary embodiment may include a three digit OEM code, a two digit model code, and a two digit software revision code. An example of an SSID is 100 (OEM), 10 (Model), 03 (software revision).
10.) Measure input AC voltage is correct.
11.) Observe and Log the Board Configurations (programmed, or via DIP Switches. Save this information as "field configuration" if it is the first time the board has been tested.
12.) Configure the board to "factory", or "Custom" settings to prepare for the test. Record this configuration in the test record. Custom settings may provide the ability to test more hardware on the board than what would typically be used.
13.) Command Pump 1 on and measure output voltage is correct.
14.) Measure Pump 1 current.

15.) Measure Heater On & Off voltage while accelerated test mode is active.

16.) Measure Ozone On & Off voltage while accelerated test mode is active.

17.) Disable accelerated test mode.

18.) Command Pump 2 on and measure output voltage is correct.

19.) Measure Pump 2 current.

20.) Command Blower on and measure output voltage is correct.

21.) Measure Blower current

22.) Command Spa Light on and measure output voltage is correct.

23.) Test all Main Panel ports.

24.) Test all aux panel ports.

25.) Test Sensor A & B input voltage accuracy.

26.) Test Freeze circuit operation.

27.) Test Sensor-A hardware fail-safe circuit (OHH).

28.) Test Sensor-B hardware fail-safe circuit (OHH).

Figure 6F:
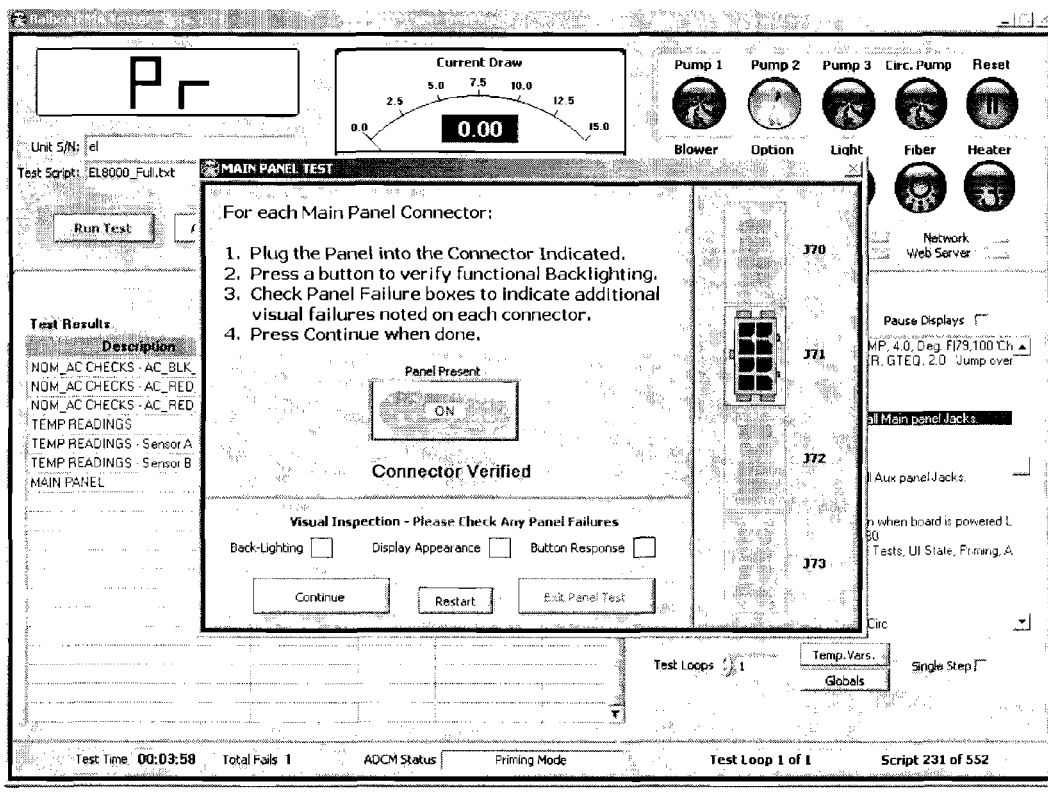

29.) Test the main Panel. FIG. 6F depicts an example screen shot of an image for an exemplary main panel test 30.) The operator may be offered the option of changing the configuration of the board (programmed, or DIP switch) to a different "shipping configuration" than what it was tested at. This shipped configuration is logged in the test report.

31.) End Powered Functional Test:

32.) Log data to server using FTP.

Figure 6G:
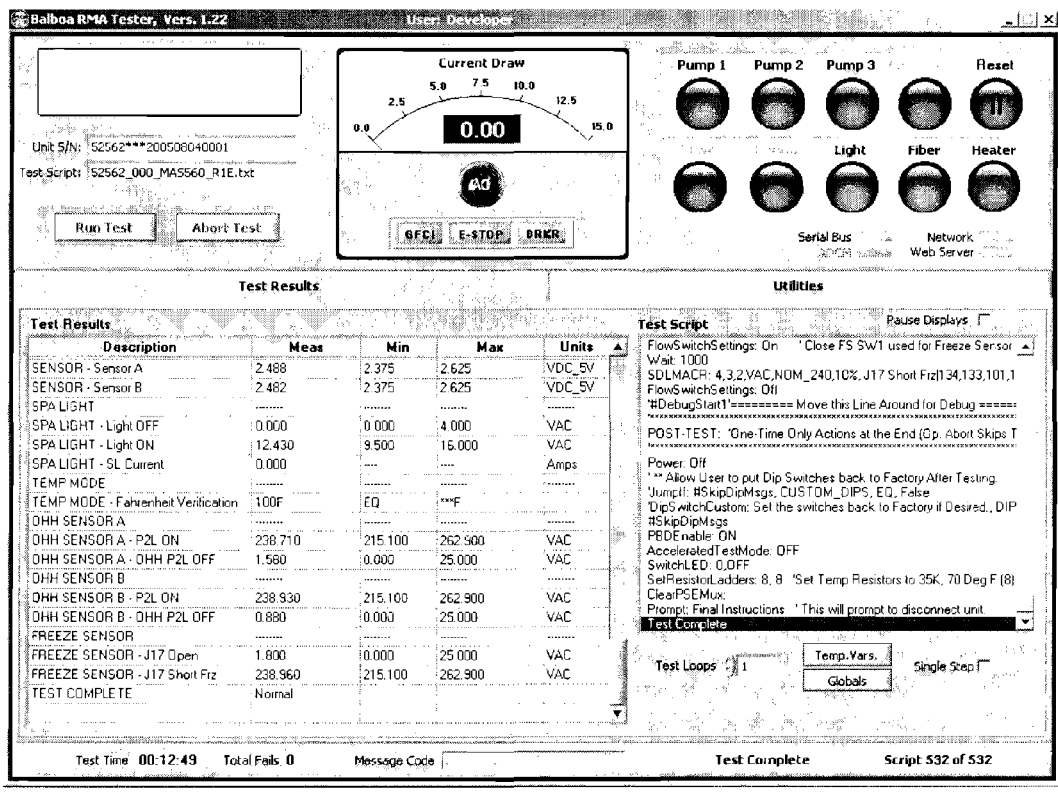
Figure 6H:
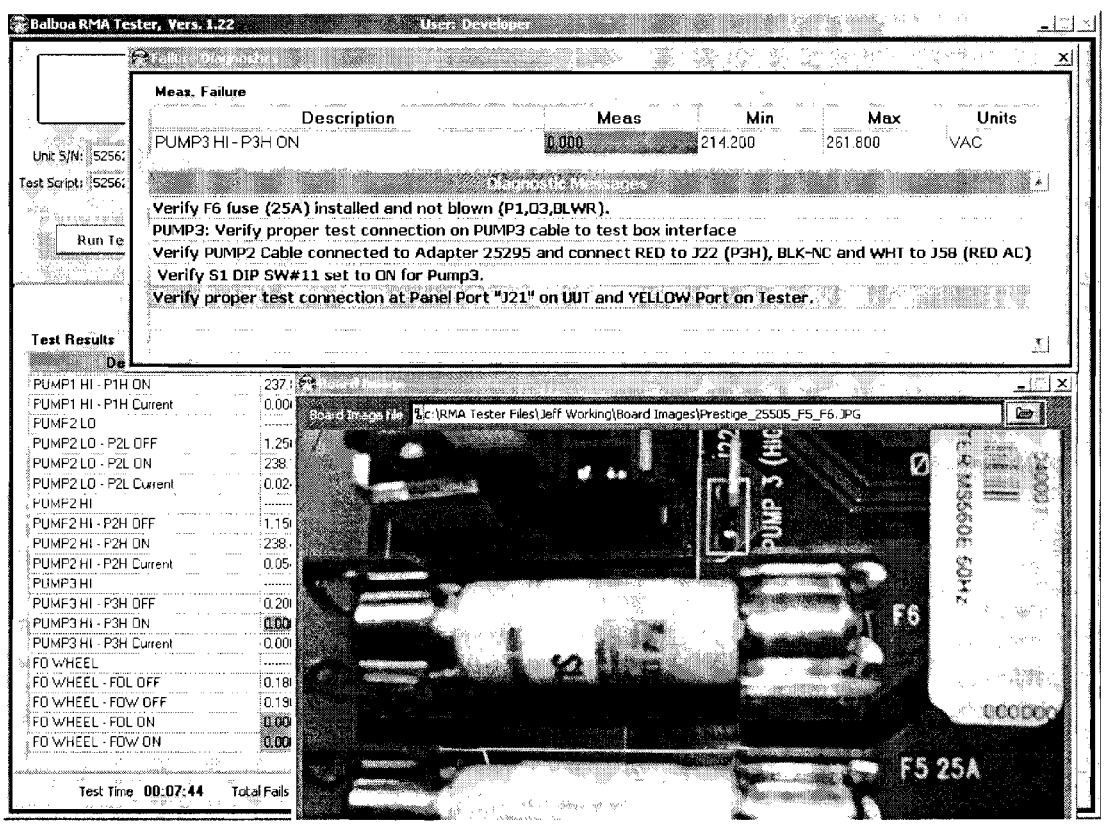

33.) Print test report. FIG. 6G depicts an exemplary screen shot of an exemplary test results page. FIG. 6H depicts an exemplary screen shot of a failed test report, with an image depicting an example suspected failure. FIG. 6I depicts an exemplary screen shot of an exemplary test result summary page.

34.) Operator prompted to disconnect UUT test cables.

35.) Go to Step 1; Operator prompted to scan in next UUT barcode.

In accordance with a further aspect of this disclosure, a method is provided for establishing warranty status of a previously fielded spa controller board, e.g. in the event the spa controller board may require service. The method is illustrated in the flow diagram shown in FIG. 7. In an exemplary embodiment, the method 400 includes (i) electronically capturing an encoded bar code pattern on the controller board (402); (ii) entering the captured encoded bar code pattern in a computer algorithm to perform a warranty check on the spa controller board to determine whether the controller board is within a predetermined warranty period (404); (iii) in the event the controller board is under warranty, issuing a manufacturer return material authorization (RMA) for the controller board authorizing return of the controller board to the manufacturer (406). If the unit is out-of-warranty, a notification of this status may be issued for the user, or electronically transmitted to the manufacturer or service organization. In an exemplary embodiment, the algorithm may include decoding the bar code pattern to determine a warranty period expiration date for the controller board, and determining that the board is subject to a manufacturer warranty if the expiration date has not passed.

In an exemplary embodiment, the bar code pattern for a spa controller board may encode data identifying the board serial number and an assigned date of manufacture of the board, or other event which determines a start of a predetermined warranty period or length. Since the system 50 may have stored thereon a database defining a warranty period for a spa controller board (e.g. two years), which commences on the data of manufacture, the expiration of the warranty period for a particular spa controller board. Hence, by reading and interpreting data encoded on the bar code pattern, the warranty status of the particular unit may be determined. Alternatively, an internet connection to a manufacturer's server and database may be established, and the warranty status determined by comparison of the serial number information and other information on the bar code pattern used to determine the warranty status of the unit. Once the warranty status is determined, then a determination can be made as to whether the unit is still under warranty, and thus whether an RMA can properly be issued. This can reduce the number of unwarranted returns to a repair depot or to the manufacturer, significantly reducing costs.

Although the foregoing has been a description and illustration of specific embodiments of the invention, various modifications and changes thereto can be made by persons skilled in the art without departing from the scope and spirit of the invention as defined by the following claims.

What is claimed is:

1. A method for functionally testing an electronic controller board for a spa system, the electronic controller board configured for electrical connection at respective terminal connectors to a source of AC line voltage, to one or more controlled line voltage load devices and to a spa panel control for inputting user commands in normal use, the electronic controller board having a microcomputer for overall control of the electronic device and at least one switch or relay, the method comprising:

electrically connecting the electronic controller board at the respective terminal connectors to corresponding test station terminal connections on a test station;

with the test station in an interface check mode prior to application of AC line voltage to the electronic controller board, automatically measuring impedances at said test station terminal connections with the test station to determine whether the electronic controller board is properly connected to the test station by comparing the measured impedances to expected impedance values;

the test station aborting the test prior to application of AC line voltage to the electronic controller board if any test station terminal connections are determined not to be properly connected to corresponding board terminal connectors, and providing an indication to an operator of failed connections between the test station and the electronic controller board causing the test abort;

preventing application of AC line voltage through the test station to the controller board unless the electronic controller board terminal connectors are properly connected to the corresponding test station terminal connections;

with the test station in a test sequence mode, conducting an automated test in which line voltage is applied to the electronic controller board, said test sequence mode including exchanging data and commands between the test station and the electronic device microcomputer, wherein the test includes:

applying AC line voltage to the electronic controller board;

controlling the microcomputer to sequentially exercise controller board functions, including controlling the microcomputer to activate the at least one switch or relay to cause AC line voltage to be applied to at least one terminal connector and to a corresponding AC line voltage load connected to a corresponding test station terminal connection; and measuring voltage and current parameters of the controller board, including a current drawn by the controller board at a time in which the at least one switch or relay is activated to apply AC line voltage to the corresponding line voltage load, to determine whether the measured parameters are within a predetermined range for proper functionality.

2. The method of claim 1, further comprising issuing a test report electronically which indicates results of the test sequence and a pass or fail board function test status.

3. The method of claim 2, wherein the test report is transmitted electronically via an internet connection to a remote server maintained by a circuit board vendor.

4. The method of claim 1, wherein said preventing application of line voltage comprises controlling a switching device system of the test station, and wherein said test sequence mode comprises actuating said switching device system to apply AC line voltage to corresponding ones of the electronic device terminal connectors.

5. The method of claim 1, wherein said exchanging data and commands between the test station and the microcomputer comprises exchanging data and commands over a serial data bus connected between the test station and the controller board microcomputer.

6. The method of claim 1, wherein the corresponding line voltage load emulates a spa heater.

7. The method of claim 1, wherein the test further comprises applying a heater test accelerator signal to the spa controller to place the spa controller in an accelerated heater testing mode to eliminate a wait time for heater operation during normal spa operation, and wherein the test station thereafter disables the accelerated heater testing mode.

8. The method of claim 1, wherein the corresponding line voltage load emulates a spa water pump.

9. The method of claim 1, wherein the test further includes applying spa panel emulation signals to a spa panel connector of the spa controller to emulate a panel data stream protocol for the spa controller.

10. The method of claim 1, wherein the source of AC line voltage is a 120V AC service or a 240 V AC service.

11. A test station for functionally testing spa controller systems for a spa system, the spa controller system having a microcomputer for overall control of the electronic device and at least one switch or relay, the controller systems configured for electrical connection at respective terminal connectors to a source of AC line voltage, to one or more controlled AC line voltage load devices and to a spa panel control for inputting user commands, the test station comprising:

a test station controller including a display;

test station terminal connections adapted for electrically connection to a spa controller system at the plurality of terminal connectors of a spa controller system to be tested, the test station terminal connections including an AC line voltage connection set configured for connection to a corresponding AC line voltage connector set comprising the terminal connectors of the spa controller system;

an AC power module configured for connection to AC line voltage, and including a switching circuit controlled by the test station controller for selectively applying AC line voltage to the AC line voltage connection set;

a measurement instrument for measuring electrical parameters including voltage, current, resistance and capacitance;

a multiplexer system for selectively connecting the measurement instrument to selected ones of the test station terminal connections under control of the test station controller;

an emulation module for emulating signals and electrical loads to be connected to the terminal connectors in normal use, the electrical loads including at least one AC line voltage load;

and wherein the test station controller is adapted, with the test station in an interface check mode prior to application of line voltage to the spa controller, to measure impedances at said test station terminal connections with the measurement instrument to determine whether the controller system is properly connected to the test station by comparing the measured impedances to expected impedance values, and to prevent application of AC line voltage through the test station to the controller system unless the controller system terminal connectors are properly connected to the corresponding test station terminal connections;

the test station controller configured to abort the test prior to application of line voltage to the spa controller if any test station terminal connections are determined not to be properly connected to corresponding spa controller terminal connectors, and providing an indication to an operator of failed connections between the test station and the spa controller causing the test abort; and wherein the test station controller is further adapted to carry out a test sequence mode comprising a test in which AC line voltage is applied to the controller system to provide electrical power to the microcomputer and the at least one switch or relay, said test sequence mode including exchanging data and commands between the test station and the electronic device microcomputer to functionally test the controller system, wherein the test sequence mode carried out by the test station controller includes:

controlling the microcomputer to sequentially exercise spa controller functions, including controlling the microcomputer to activate the at least one switch or relay to cause AC line voltage to be applied to at least one terminal connector and to a corresponding AC line voltage load connected to a corresponding test station terminal connection by the emulation module; and measuring voltage and current parameters of the controller board, including a current drawn by the controller board at a time in which the at least one switch or relay is activated to apply AC line voltage to the corresponding line voltage load, to determine whether the measured parameters are within a predetermined range for proper functionality.

12. The test station of claim 11, wherein the spa controller is configured to control a line voltage spa heater connected to a set of heater terminal connectors as one of said line voltage load devices, and includes a normally disabled heater test accelerator function, and wherein the test station is configured to apply a heater test accelerator signal to the spa controller during the test sequence mode to place the spa controller in an accelerated heater testing mode to bypass a wait time for heater operation during normal spa operation, wherein the spa controller controls a switch or relay to apply line voltage to the heater terminal connectors and the voltage at the heater terminal connectors is measured, and thereafter the accelerated heater mode is disabled by the test station.

13. The test station of claim 11, wherein said emulation module includes a panel protocol emulator circuit configured for connection to a spa panel connector of the spa controller system to emulate a data stream protocol for panel control and display of the spa control system.

14. The test station of claim 11, wherein the spa controller system is configured to receive a temperature sensor signal at a temperature sensor connector, and said emulation module includes a temperature sensor emulation circuit configured for connection to the temperature sensor connector and to provide signals emulating temperatures over a range of temperatures.

15. The test station of claim 11, wherein the spa control system to be tested is a previously fielded unit suspected of having a need for repair, and the test station further includes a plurality of test script files, each file configured to define a test sequence mode for a different predetermined type or model of spa control system, and wherein the test station is configured to select one of the plurality of test script files to carry out a test sequence mode compatible with the previously fielded unit.

16. The test station of claim 11, wherein the source of line voltage provides either 120 V AC or 240 V AC.

17. The test station of claim 11, wherein the test station controller is configured to display images of spa controller system terminal connectors and corresponding test station terminal connections to facilitate manual connection of the spa control system to the test station.

* * * * *